*(12)* United States Patent
Maruya et al.

(10) Patent No.: US 6,844,834 B2
(45) Date of Patent: Jan. 18, 2005

(54) PROCESSOR, ENCODER, DECODER, AND ELECTRONIC APPARATUS

(75) Inventors: Satoshi Maruya, Kanagawa (JP); Hiroshi Iwasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 56 days.

(21) Appl. No.: 10/441,543

(22) Filed: May 20, 2003

(65) Prior Publication Data

US 2004/0021591 A1 Feb. 5, 2004

(30) Foreign Application Priority Data

May 22, 2002 (JP) ........................................ 2002-147148

(51) Int. Cl.[7] .............................................. H03M 7/40
(52) U.S. Cl. ............................. 341/60; 341/61; 341/50; 341/55
(58) Field of Search .............................. 341/60, 61, 50, 341/55

(56) References Cited

U.S. PATENT DOCUMENTS 4,853,888 A * 8/1989 Lata et al. ..................... 341/23
6,133,859 A * 10/2000 Deygas et al. ................ 341/67
6,144,321 A * 11/2000 Deygas et al. ................ 341/67
6,388,583 B1 * 5/2002 Long et al. .................... 341/50
6,404,359 B1 * 6/2002 Sakai ............................ 341/67

* cited by examiner

*Primary Examiner*—Michael Tokar
*Assistant Examiner*—Lam T. Mai
(74) *Attorney, Agent, or Firm*—Frommer Lawrence & Haug LLP; William S. Frommer

(57) ABSTRACT

The present invention provides a processor including a bit-shift circuit for inputting pieces of data held sequentially in a main register and an auxiliary register, shifting the piece of data bit after bit in accordance with a pointer and a bit count and outputting the shifted data by execution of an unpacking instruction specifying the bit count; a mask circuit for masking data output by the bit-shift circuit in accordance with the pointer and the bit count in the execution of the unpacking instruction; and a pointer-updating circuit for updating the value of the pointer by the bit count in the execution of the unpacking instruction.

20 Claims, 24 Drawing Sheets

F I G. 7
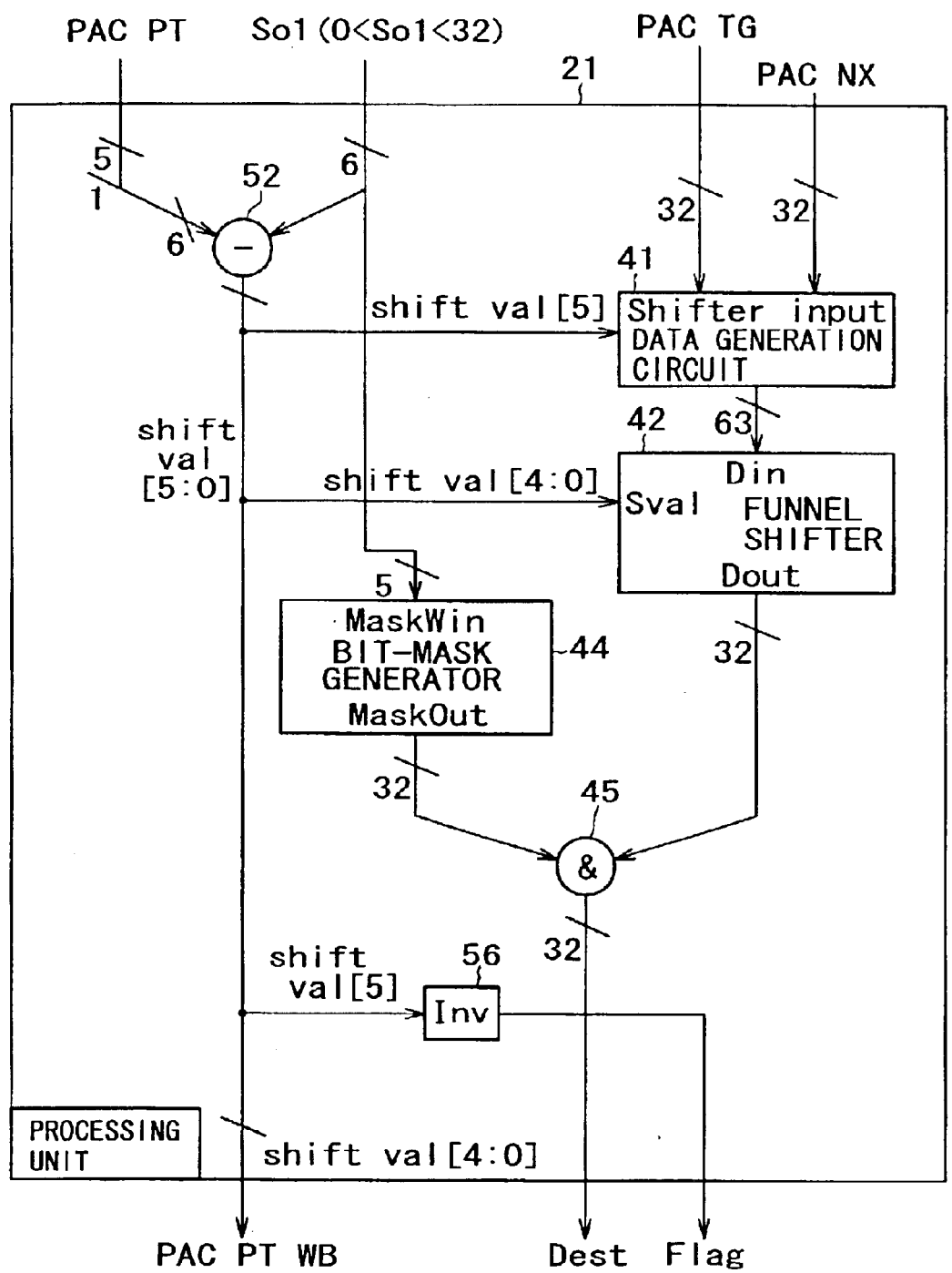

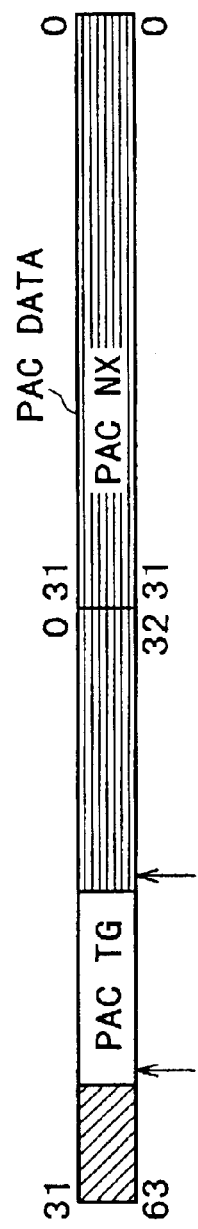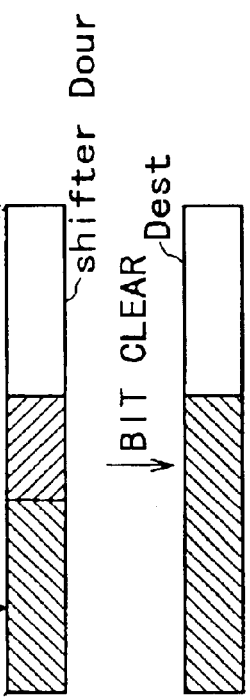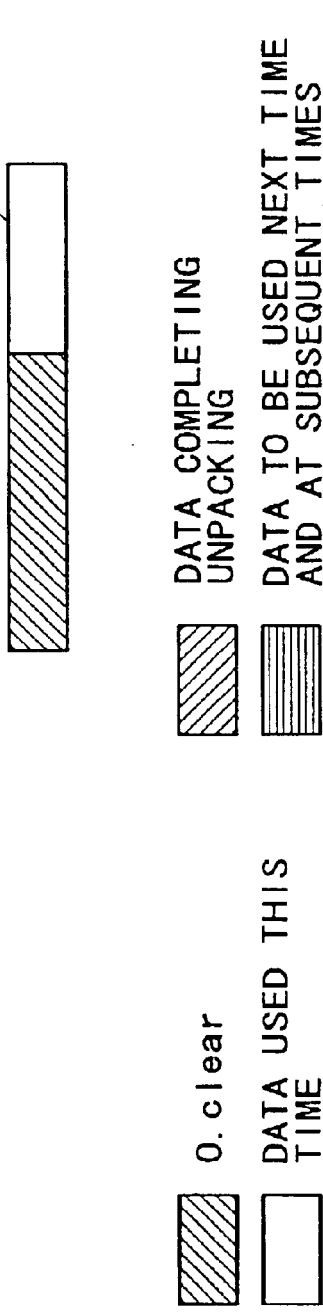

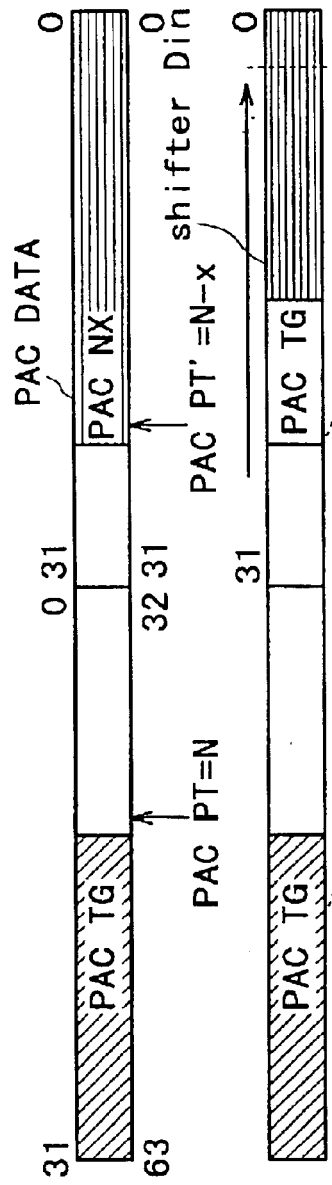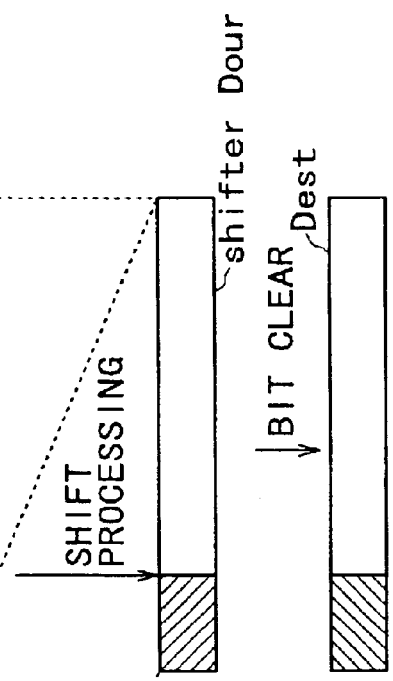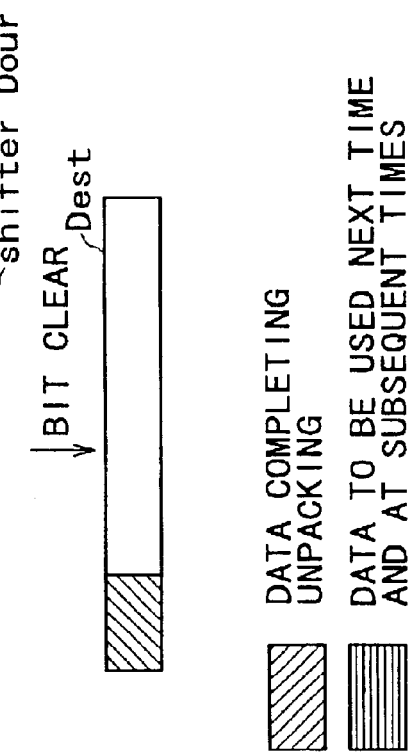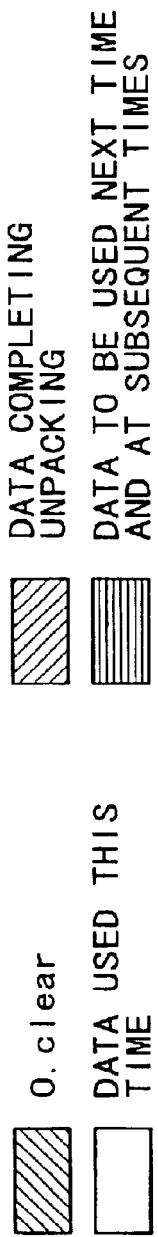
FIG. 10A
FIG. 10B
FIG. 10C
FIG. 10D

FIG. 12

```
 1 :; EXAMPLE OF SPLITTING 32-bit DATA FROM BIT STREAM INTO
 2 :; 7-bit UNITS TO BE OUTPUT TO Data_out
 3 :
 4 :     load    r2,  [Bit-stream]  ;FETCH NEXT 32-bit BIT STREAM
 5 :     store   r2,  [PAC_TG]
 6 :     load    r2,  [Bit_stream]  ;FETCH 32-bit BIT STREAM
 7 :     store   r2,  [PAC_NX]
 8 :     store   31,  [PAC_PT]
 9 :loop:
10 :     upac    r3,  7
11 :     store   r3,  [Data_out]    ;OUTPUT 7-bit SPLIT DATA
12 :     b.nc    loop
13 :     load    r2,  [Bit-stream]  ;FETCH NEXT 32-bit BIT STREAM
14 :     store   r2,  [PAC_NX]
15 :     b       loop
```

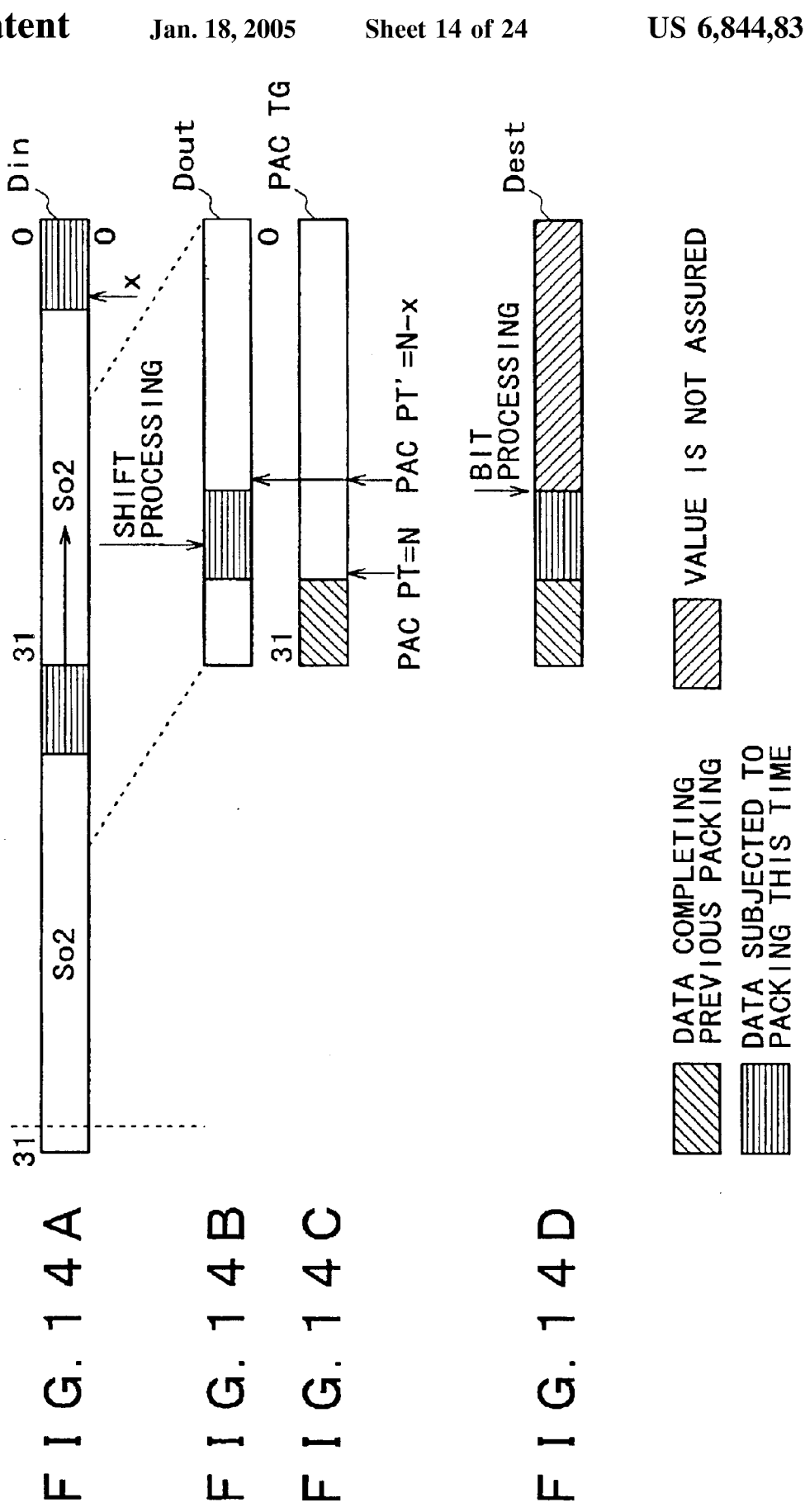

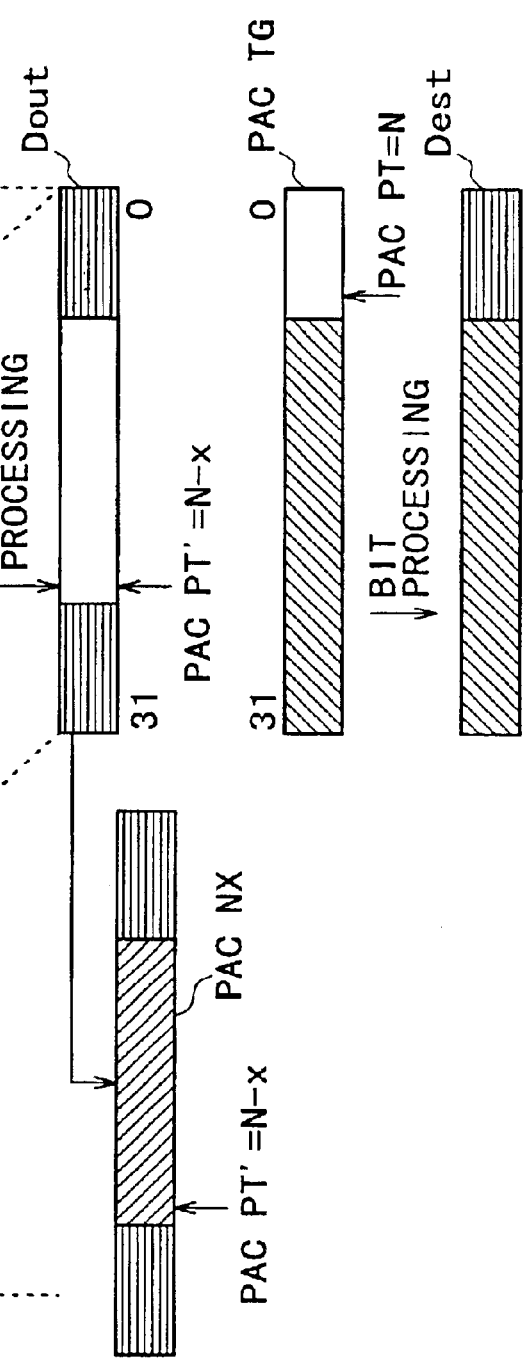
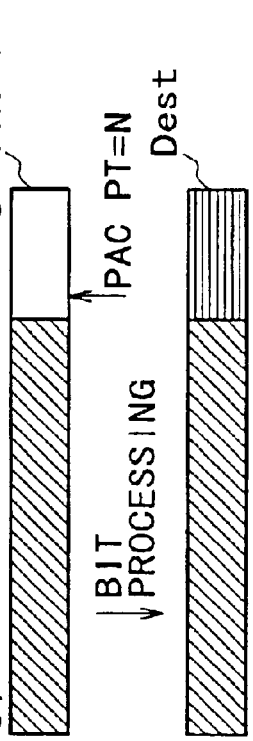
FIG. 15A
FIG. 15B
FIG. 15C
FIG. 15D
FIG. 15E

FIG. 16

```
1:; EXAMPLE OF PACKING 7-bit UNITS INTO 32-bit DATA
2:
3:      store  31, [PAC_PT]
4:loop:
5:      load   r2, [[Data_in]    ; FETCH 7-bit DATA
6:      pac    r3, 7, r2
7:      b.nc   loop
8:      store  r3, [Data_out]    ;STORE DATA PACKED INTO 32 BITS
9:      b      loop
```

PROCESSOR, ENCODER, DECODER, AND ELECTRONIC APPARATUS

BACKGROUND OF THE INVENTION

The present invention relates to a processor, an encoder, a decoder, and an electronic apparatus. Typically, the present invention can be applied to an encoder and a decoder, which are provided for processing an audio signal. By virtue of the present invention, hardware can be configured to allow instructions each specifying a bit count to be executed to carry out unpacking and packing processes so that variable-length coded data can be processed at a high speed and a low power consumption while maintaining the general-purpose characteristic of the hardware at a high level.

Traditionally, in a processor serving as a processing circuit for executing a variety of programs, various kinds of processing can be carried out at a high speed by adoption of the so-called pipeline-processing technique. FIG. 22 is a block diagram showing a pipeline process carried out by an ordinary processor 1. In the configuration shown in the figure, the processor 1 has a five-stage pipeline. The five stages of the pipeline are an IF stage, a REG stage, an EXE stage, a MEM stage, and a WB stage. At the IF stage, an instruction is fetched from a memory 2. At the REG stage, the instruction is decoded and data is fetched from a core register. At the EXE stage, the instruction is executed by an ALU (Arithmetic Logic Unit) in accordance with a result of the decoding process carried out at the REG stage. At the MEM stage, data is input from and/or output to the memory 2 by way of a bus. At the WB stage, data is written back into the core register. By carrying out the processes at the stages described above, instructions and pieces of data are transferred sequentially from a component to another in the processor 1 and processed by the arithmetic logic unit.

In a variable-length coding process, video and audio signals are compressed. In this case, data to be compressed is a data series having a fixed bit count. The data series is compressed to produce pieces of data having different bit counts. The variable-length pieces of data are concatenated with each other to generate a continuous bit stream.

In a processor for encoding and decoding data of such a kind, a barrel-shift processing unit is used for carrying out an unpacking process. In the unpacking process, the bit stream is decoded to sequentially generate pieces of encoded data having different bit counts. A packing process using the barrel-shift processing unit is an inverse process of the unpacking process. In the packing process, pieces of encoded data having different bit counts are sequentially arranged to form a bit stream.

FIG. 23 shows a flowchart representing an unpacking process using such a barrel-shift processing unit. In the conventional processor, after a bit stream having a length equal to the bit count of a register employed in the processor has been input in, an unpacking-process left-shift instruction as well as a logical right-shift instruction are executed and the barrel-shift processing unit is used to set significant bits of this word data at a logic value of 0. The word data is the input bit stream having a length equal to the bit count of a register employed in the processor. In this way, variable-length coded data having a size equal to one code is obtained. It is to be noted that in the following description, a register PAC TG is a register for storing the bit stream having a length equal to the register bit count, that is, a register for storing the word data, and a register PAC PT is a register for storing a pointer pointing to the position of a bit on the bit stream stored in the register PAC TG. The pointer stored in the register PAC PT has a value in the range 0 to N−1. Symbols REG X1 and REG X2 each denote a register used in the intermediate processing.

To put it in detail, the flowchart shown in FIG. 23 begins with a step SP1 at which a bit-streaming process is carried out to store word data to be processed in the register PAC TG. Then, at the next step SP2, the processor makes the first bit of encoded data to be extracted becomes the MSB (Most Significant Bit). To put it in detail, the processor shifts the data stored in the register PAC TG in the left direction by (N−PAC PT−1) bits and then stores the shifted data in the register REG X1. After this left-shift processing, the pointer stored in the register PAC PT is updated.

Then, at the next step SP3, the processor makes the last bit of the encoded data to be extracted becomes the LSB (Least Significant Bit). To put it in detail, the processor logically shifts the data stored in the register REG X1 in the right direction by (N−Num) bits where (N−Num) is the number of bits included in the encoded data to be extracted. Each time the data stored in the register REG X1 is shifted in the right direction by 1 bit, a logic value of 0 is inserted into the left end of the register REG X1. By shifting the data stored in the register REG X1 in the right direction in this way, the bits more significant than the first bit of the encoded data are each set at the logic value of 0. The result of the logical right shift operation is left in the register REG X1. After this logical right shift processing, the pointer stored in the register PAC PT is updated to a value indicating the number of meaningful bits included in the data stored in the register REG X1.

Then, at the next step SP4, the processor forms a judgment as to whether or not the meaningful bits of the data stored in the register REG X1 form a piece of encoded data, that is, whether or not Num is smaller than the value stored in the register PAC PT where symbol Num denotes the number of bits to be masked. If the outcome of the judgment is a negation, the processor continues the processing to a step SP5 at which the contents of the register PAC PT are updated by subtracting the number Num of bits to be masked from the contents to result in a value of (PAC PT−Num).

Upon completion of the process carried out at the step SP5, the data indicated by the register PAC PT and stored in the register REG X1 forms an entire piece of encoded data. Then, the flow of the processing then goes on to the next step SP6 to end the unpacking processing to generate a code of unpacked data.

If the encoded data following the data stored in the register REG X1 remains to be processed at the end of the unpacking processing to generate a code of unpacked data as described above as indicated by an acknowledgement outcome of the judgment formed at the step SP4, the processor transfers the remaining data to the register PAC TG and the processing described above is repeated. That is to say, if a piece of encoded data to be processed is stretched over the following bit stream for the specific data stored in the register PAC TG as indicated by an acknowledgement outcome of the judgment formed at the step SP4, the processor transfers the remaining data to the register PAC TG and the processing described above is repeated.

In this case, the flow of the processing goes on from the step SP4 to a step SP8 at which the processor shifts the data stored in the register REG X1 in the left direction by the number of supplementary bits to be added to the data stored in the register REG X1. The number of added supplementary bits is N−Num−1. Then, the data shifted in the left direction is stored back in the register REG X1. Subsequently, at the next step SP9, the following bit stream is loaded into the register PAC TG. Then, at the next step SP10, the processor logically shifts the data stored in the register PAC TG in the right direction by (N-Num) bits where (N-Num) is the number of supplementary bits to be added to the data stored in the register REG X1. Each time the data stored in the register PAC TG is shifted in the right direction by 1 bit, a logic value of 0 is inserted into the left end of the register PAG TG. By shifting the data stored in the register PAC TG in the right direction in this way, the bits more significant than the first bit of the encoded data are each set at the logic value of 0. The result of the logical right shift operation is left in the register REG X2.

Then, at the next step SP11, the data stored in the register REG X1 and the data stored in the register REG X2 are subjected to a logical sum (OR) process to concatenate the data stored in the register REG X1 with the data stored in the register REG X2 and data obtained as a result of the concatenation process is stored in the register REG X1.

Subsequently, the processor continues the processing to the step SP12 at which the contents of the register PAC PT are updated by subtracting the number Num of bits to be extracted from the contents to result in a value of (PAC PT−Num). Then, the flow of the processing then goes on to the next step SP6 to end the unpacking processing to generate a code of unpacked data.

FIG. 24 shows a flowchart representing a concrete decoding process based on the unpacking process described above. To be more specific, the processing represented by the flowchart shown in FIG. 24 is a Huffman decoding process of a bit stream. It is to be noted that processing steps identical with their counterpart steps of the flowchart shown in FIG. 23 are denoted by the same reference notations as the counterpart steps of the flowchart shown in FIG. 24 and their detailed explanation is not repeated. It is also worth noting that the maximum length of Huffman codes in the processing represented by the flowchart shown in FIG. 24 is denoted by symbol Num.

The flowchart shown in FIG. 24 begins with a step SP1 at which N-bit data to be processed is extracted from the bit stream being decoded from the bit stream and loaded into the register PAC TG. In addition, the register PAC PT is set at a value of (N−1). Then, at the next step SP2, the processor carries out the left-shift processing in the same way as described above. Subsequently, at the next step SP3, the processor carries out the logical right-shift process.

Then, at the next step SP14, the processor compares the maximum length Num of Huffman codes with the value stored in the register PAC PT in order to form a judgment whether or not the length of the meaningful data stored in the register PAC PT is smaller than the Huffman-code maximum length Num. If the outcome of the judgment is a negation, the flow of the processing goes on to a step SP15 at which, by using the data stored in the register REG X1, the processor looks up a decoding table to find a code as a result of the decoding process. Then, at the next step SP16, also by using the data stored in the register REG X1, the processor looks up a table for determination of a code length to find the length of the code found as a result of the decoding process.

Subsequently, at the next step SP17, the processor compares the code length found at the step SP16 with the value stored in the register PAC PT in order to form a judgment whether or not a portion or all of subsequent coded data is left in the register REG X1. If the outcome of the judgment indicates that a portion of all or subsequent coded data is left in the register REG X1, the flow of the processing goes on to the step SP5 at which the value stored in the register PAC PT is updated by a quantity corresponding to the resulting code. Finally, the flow of the processing goes on to a step SP6 at which the processing to process a code is finished. In order to process the subsequent code, the processor repeats the processing described above starting with the step SP1.

If the outcome of the judgment formed at the step SP17 is a negation, on the other hand, the flow of the processing goes on from the step SP17 to a step SP18 at which subsequent stream data is loaded into the register PAC TG. Than, at the next step SP19, a value of the expression (N-PAC PT+Huffman length) is recorded in the register PAC PT to update the value stored in the register PAC PT to a value according to the processing carried out at the step SP18. Finally, the flow of the processing goes on to a step SP6 at which the processing to process a code is finished.

For the specific data stored in the register PAC TG, a piece of encoded data may be stretched over the following bit stream. In this case, the result of the judgment formed at the step SP14 is an acknowledgment and the flow of the processing goes on from the step SP14 to the step SP8 at which the processor shifts the data stored in the register REG X1 in the left direction by (N-Num−1) bits. Then, the data shifted in the left direction is stored back in the register REG X1. Subsequently, at the next step SP9, the following bit stream is loaded into the register PAC TG. Then, at the next step SP10, the processor logically shifts the data stored in the register PAC TG in the right direction by (N-Num) bits. Each time the data stored in the register PAC TG is shifted in the right direction by 1 bit, a logic value of 0 is inserted into the left end of the register PAG TG. By shifting the data stored in the register PAC TG in the right direction in this way, the bits more significant than the first bit of the encoded data are each set at the logic value of 0. The result of the logical right shift operation is left in the register REG X2. Then, at the next step SP11, the data stored in the register REG X1 and the data stored in the register REG X2 are subjected to a logical sum (OR) process to concatenate the data stored in the register REG X1 with the data stored in the register REG X2 and data obtained as a result of the concatenation process is stored in the register REG X1. Subsequently, the flow of the processing goes on to the step SP15.

By the way, if a bit stream is processed as variable-length encoded data by using hardware, the look-up table is a fixed table embedded in the hardware, resulting in a lack of general-purpose characteristics. Since a bit stream is processed as variable-length encoded data by using a processor as described above, however, the look-up table can be updated to keep up with a variety of encoding techniques.

If a bit stream is processed as variable-length encoded data by using the conventional processor, however, a plurality of shift operations must be carried out. Thus, in a process of one code, a large number of cycles is required. In this connection, if the processing is carried out by adoption of a pipeline technique, a branch process will put the pipeline processing in a state of stagnation, which makes it impossible to carry out the processing by adoption of the pipeline technique at a sufficiently high speed. Thus, it is difficult to carry out the processing of a bit stream as variable-length encoded data by using a processor at a high speed and at a low power consumption. In the end, in the packing and unpacking processes described above, dedicated hardware is provided. As a result, the use of a processor in conjunction with such dedicated hardware also raises a problem of a lack of general-purpose characteristics.

In the processing represented by the flowchart shown in FIG. 23, a process to count the number of bits included in undecoded data left in the register and the branch processing carried out at the step SP4 are each a processing load. In addition, the number of steps in the processing following the branch step SP4 varies in dependence on the destination of the branch. The variations in post-branch step count are also a processing load. In addition, in the packing process carried out as an inverse process of the unpacking process, similar conditional branching processes are required so that a two-stage process is required. Moreover, in the case of the processing represented by the flowchart shown in FIG. 24, accesses to a memory are also a big overhead.

A typical method to solve the problem is proposed in Japanese Patent Laid-open No. 2001-202242. In accordance with this method, the processor is provided with an instruction for directly converting a variable-length code into a value representing the code length and the code itself. In the case of this method, however, there is raised a problem that the representation of the code itself is fixed by the instruction and the maximum bit count is restricted by the circuit scale. Thus, this method is effective only for code with a small code length such as picture data. However, the method cannot be practically applied to a process to encode sound data because a large table is required in such a process. In addition, it is actually difficult to change specifications in the future and to keep up with a plurality of systems.

In accordance with a method disclosed in Japanese Patent Laid-open No. 2001-516917, on the other hand, an address is issued for an unpacking instruction and a lookup table is referenced. In the case of this method, however, an instruction circuit requires dedicated complex circuits such as a table memory and an address generator. In addition, the method has a shortcoming that the implementation of this instruction and the number of applications for this instruction are limited.

It is to be noted that the method disclosed in Japanese Patent Laid-open No. 2001-516917 includes an extract instruction and a residue extract instruction as instructions for extracting variable-length encoded data from a bit stream. Data is extracted from a bit stream and loaded into a register by using the extract instruction and, in order to process all the data stored in the register, the residue extract instruction must be executed. That is to say, since there are different usages of these two instructions, their proper use is cumbersome.

In the case of a method disclosed in Japanese Patent Laid-open No. 2001-156645, on the other hand, a multiplexer of a shifter is used to process a variable-length bit array. However, this method has a shortcoming that, in the case of a 32-bit bus width, for example, only data having a length of up to 16 bits can be packed an unpacked.

SUMMARY OF THE INVENTION

It is thus an object of the present invention addressing the problems described above to provide a processor as well as an encoder, a decoder, and an electronic apparatus, which are based on the processor capable of processing variable-length encoded data at a high speed and a low power consumption while maintaining the general-purpose characteristic at a high level.

In order to solve the problems described above, according to a first aspect of the present invention, there is provided a processor including a bit-shift circuit for inputting pieces of data held sequentially in a main register and an auxiliary register, shifting the piece of data bit after bit in accordance with a pointer and a bit count and outputting the shifted data by execution of an unpacking instruction specifying the bit count; a mask circuit for masking data output by the bit-shift circuit in accordance with the pointer and the bit count in the execution of the unpacking instruction; and a pointer-updating circuit for updating the value of the pointer by the bit count in the execution of the unpacking instruction.

In addition, according to a second aspect of the present invention, there is provided a processor including a packing-process bit-shift circuit for shifting input data bit after bit in accordance with a pointer and outputting the shifted data by execution of a packing instruction specifying a bit count; a packing-process mask circuit for masking data output by the packing-process bit-shift circuit and data output from a main register in accordance with the pointer and the bit count in the execution of the packing instruction; a packing-process data-storing circuit for concatenating data output by the packing-process mask circuit with the input data and storing a result of concatenation in the main register in the execution of the packing instruction; and a packing-process pointer-updating circuit for updating the value of the pointer by the bit count in the execution of the packing instruction.

Furthermore, according to a third aspect of the present invention, there is provided an encoder for generating a bit stream by concatenating pieces of data obtained as a result of a variable-length encoding process based on a packing process carried out by a processor, which is capable of packing input data, even if the input data is variable-length encoded data, by employing components including a packing-process bit-shift circuit for shifting the input data bit after bit in accordance with a pointer and outputting the shifted data by execution of a packing instruction specifying a bit count; a packing-process mask circuit for masking data output by the packing-process bit-shift circuit and data output from a main register in accordance with the pointer and the bit count in the execution of the packing instruction; a packing-process data-storing circuit for concatenating data output by the packing-process mask circuit with the input data and storing a result of concatenation in the main register in the execution of the packing instruction; and a packing-process pointer-updating circuit for updating the value of the pointer by the bit count in the execution of the packing instruction.

Moreover, according to a fourth aspect of the present invention, there is provided a decoder for sequentially processing pieces of variable-length encoded data, which are extracted from a bit stream including the pieces of variable-length encoded data in an unpacking process carried out by a processor capable of unpacking a continuous portion of the bit stream, even if the continuous portion is spread over a main register and an auxiliary register, by employing components including a bit-shift circuit for inputting pieces of data held sequentially in the main register and the auxiliary register, shifting the piece of data bit after bit in accordance with a pointer and a bit count and outputting the shifted data by execution of an unpacking instruction specifying the bit count; a mask circuit for masking data output by the bit-shift circuit in accordance with the pointer and the bit count in the execution of the unpacking instruction; and a pointer-updating circuit for updating the value of the pointer by the bit count in the execution of the unpacking instruction.

In addition, according to a fifth aspect of the present invention, there is provided an electronic apparatus for processing variable-length encoded data by using a processor, which is capable of processing input data, even if the input data is variable-length encoded data, by employing components including a packing-process bit-shift circuit for shifting the input data bit after bit in accordance with a pointer and outputting the shifted data by execution of a packing instruction specifying a bit count; a packing-process mask circuit for masking data output by the packing-process bit-shift circuit and data output from a main register in accordance with the pointer and the bit count in the execution of the packing instruction; a packing-process data-storing circuit for concatenating data output by the packing-process mask circuit with the input data and storing a result of concatenation in the main register in the execution of the packing instruction; and a packing-process pointer-updating circuit for updating the value of the pointer by the bit count in the execution of the packing instruction.

Furthermore, according to a sixth aspect of the present invention, there is provided an electronic apparatus for processing variable-length encoded data by using a processor, which is capable of processing a continuous portion of a bit stream, even if the continuous portion is spread over a main register and an auxiliary register, by employing components including: a bit-shift circuit for inputting pieces of data held sequentially in the main register and the auxiliary register, shifting the piece of data bit after bit in accordance with a pointer and a bit count and outputting the shifted data by execution of an unpacking instruction specifying the bit count; a mask circuit for masking data output by the bit-shift circuit in accordance with the pointer and the bit count in the execution of the unpacking instruction; and a pointer-updating circuit for updating the value of the pointer by the bit count in the execution of the unpacking instruction.

In accordance with the first aspect of the present invention, there is provided a processor including a bit-shift circuit for inputting pieces of data held sequentially in a main register and an auxiliary register, shifting the piece of data bit after bit in accordance with a pointer and a bit count and outputting the shifted data by execution of an unpacking instruction specifying the bit count; a mask circuit for masking data output by the bit-shift circuit in accordance with the pointer and the bit count in the execution of the unpacking instruction; and a pointer-updating circuit for updating the value of the pointer by the bit count in the execution of the unpacking instruction.

Thus, by execution of an unpacking instruction specifying the bit count in a hardware configuration, a series of unpacking processes can be carried out in accordance with the specified bit count. It is therefore possible to carry out the processing at a high speed and to process variable-length encoded data at a low power consumption while maintaining the good general-purpose characteristic of being capable of keeping up with various kinds of variable-length encoded data by properly setting a lookup table.

In addition, in accordance with the second aspect of the present invention, there is provided a processor including: a packing-process bit-shift circuit for shifting input data bit after bit in accordance with a pointer and outputting the shifted data by execution of a packing instruction specifying a bit count; a packing-process mask circuit for masking data output by the packing-process bit-shift circuit and data output from a main register in accordance with the pointer and the bit count in the execution of the packing instruction; a packing-process data-storing circuit for concatenating data output by the packing-process mask circuit with the input data and storing a result of concatenation in the main register in the execution of the packing instruction; and a packing-process pointer-updating circuit for updating the value of the pointer by the bit count in the execution of the packing instruction.

Thus, by execution of a packing instruction specifying the bit count, a series of packing processes can be carried out in accordance with the specified bit count. It is therefore possible to carry out the processing at a high speed and to process variable-length encoded data at a low power consumption while maintaining the good general-purpose characteristic of being capable of keeping up with various kinds of variable-length encoded data by properly setting a lookup table.

Furthermore, with this configuration, there is provided an encoder, a decoder, and electronic apparatus each employing a processor, which is capable of processing variable-length encoded data at a high speed and a low power consumption while maintaining the good general-purpose characteristic.

BRIEF DESCRIPTION OF THE DRAWINGS

These and other objects of the invention will be seen by reference to the description, taken in connection with the accompanying drawing, in which:

FIG. 7 is a block diagram showing an unpacking-process configuration of the processing unit shown in FIG. 6;

FIGS. 9A to 9D are explanatory diagrams showing pieces of data processed in an unpacking process carried out by the configuration shown in FIG. 7;

FIGS. 10A to 10D are explanatory diagrams showing pieces of data processed in an unpacking process, which is carried out by the configuration shown in FIG. 7 in case a process in a shift register involves the two data registers unlike the process to unpack the data shown in FIGS. 9A to 9D;

FIG. 12 shows a typical actual program represented by the flowchart shown in FIG. 11;

FIGS. 14A to 14D are explanatory diagrams showing pieces of data processed in a packing process carried out by the configuration shown in FIG. 8;

FIGS. 15A to 15E are explanatory diagrams showing pieces of data processed in a packing process, which is carried out by the configuration shown in FIG. 8 in case the process involves the following word unlike the process to unpack the data shown in FIGS. 14A to 14D;

FIG. 16 shows a typical actual program using a packing instruction;

DETAILED DESCRIPTION OF THE PREFERRED EMBODIMENTS

Preferred embodiments of the present invention are described by referring to the diagrams as follows.

(1): First Embodiment

Figure 1:
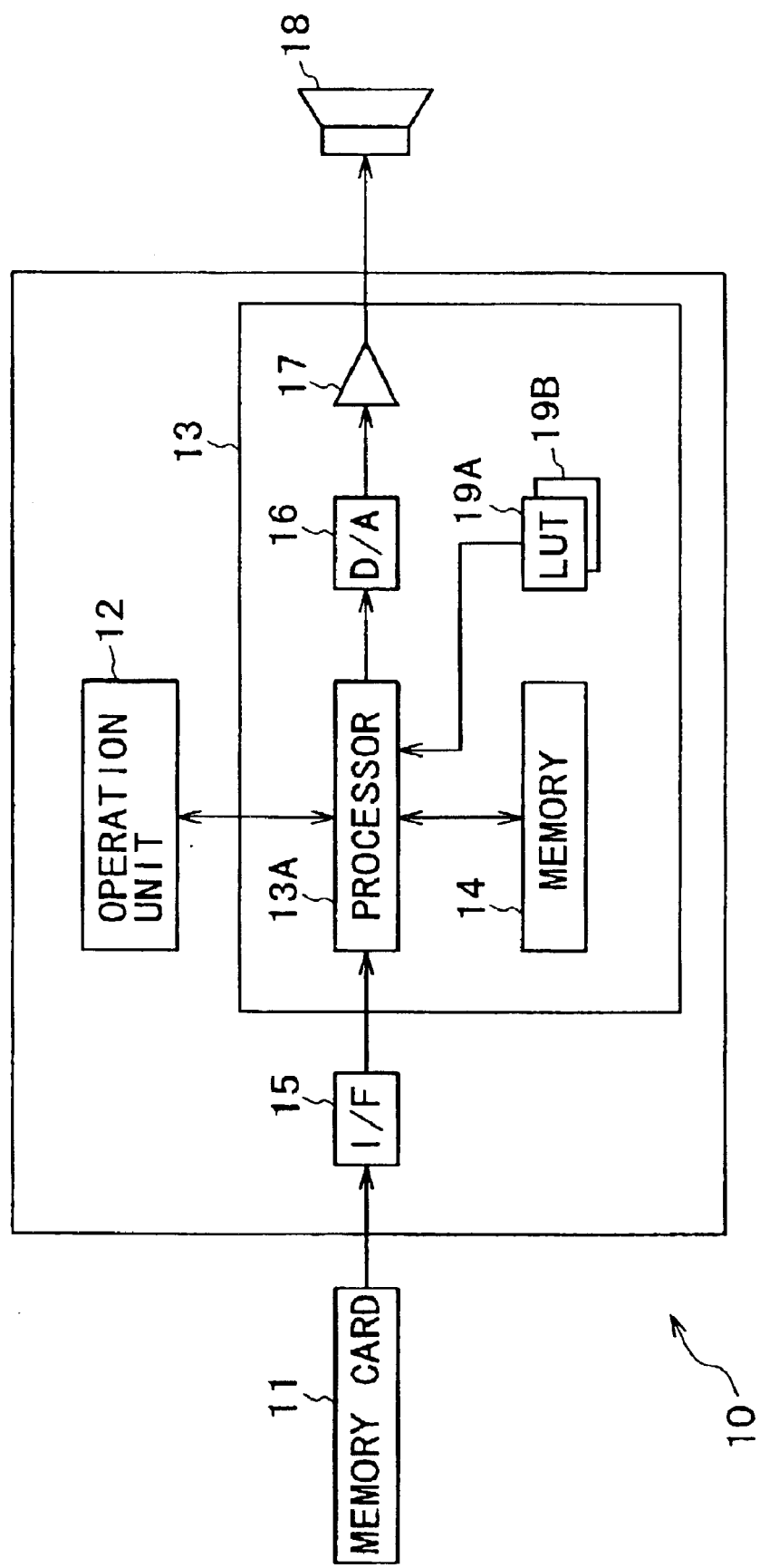
FIG. 1 is a block diagram showing a reproduction apparatus implemented by a first embodiment of the present invention.

FIG. 1 is a block diagram showing a reproduction apparatus 10, which is an electronic apparatus implemented by a first embodiment of the present invention. The reproduction apparatus 10 is a portable audio apparatus, which a memory card 11 can be mounted on and demounted from. The reproduction apparatus 10 is capable of reproducing audio data recorded on the memory card 11 so as to allow the user to listen to the reproduced audio data.

To put it in detail, the reproduction apparatus 10 has an interface (I/F) 15, an operation unit 12, an embedded memory 14, and an integrated circuit 13 including a processor 13A for carrying out a series of processing procedures recorded in the embedded memory 14 in accordance with commands entered by the user by operating the operation unit 12. By carrying out these processing procedures, audio data is loaded from the memory card 11 onto the processor 13A by way of the interface 15. The integrated circuit 13 also includes an amplifier circuit 17 and an embedded digital/analog (D/A) conversion circuit 16 for converting audio data decompressed by the processor 13A into an analog signal. This analog signal is amplified by the amplifier circuit 17 before being output to an earphone 18.

In this embodiment, the audio data stored in the memory card 11 is data obtained as a result of a data compression process adopting an MP3 (MPEG Audio Layer 3) technique or an ATRAC (Adaptive Transform Acoustic Coding) technique where MPEG is the abbreviation of Moving Picture Experts Group. This data compression technique is a variable-length encoding technique using the Huffman code. In accordance with a command issued by the user, the processor 13A selects a processing program in dependence on the adopted data compression technique and loads the selected processing program into the embedded memory 14. In addition, by execution of the loaded processing program, the processor 13A sequentially makes accesses to the memory card 11 to get audio data and decode the audio data in a pipeline process referencing an LUT (Lookup Table) 19A or 19B in order to decompress the audio data.

Thus, in this embodiment, the processor 13A is used as a processor common to audio data obtained as a result of compression processes adopting a variety of encoding techniques. To be more specific, the processor 13A is used to process two different kinds of audio data.

Figure 2:
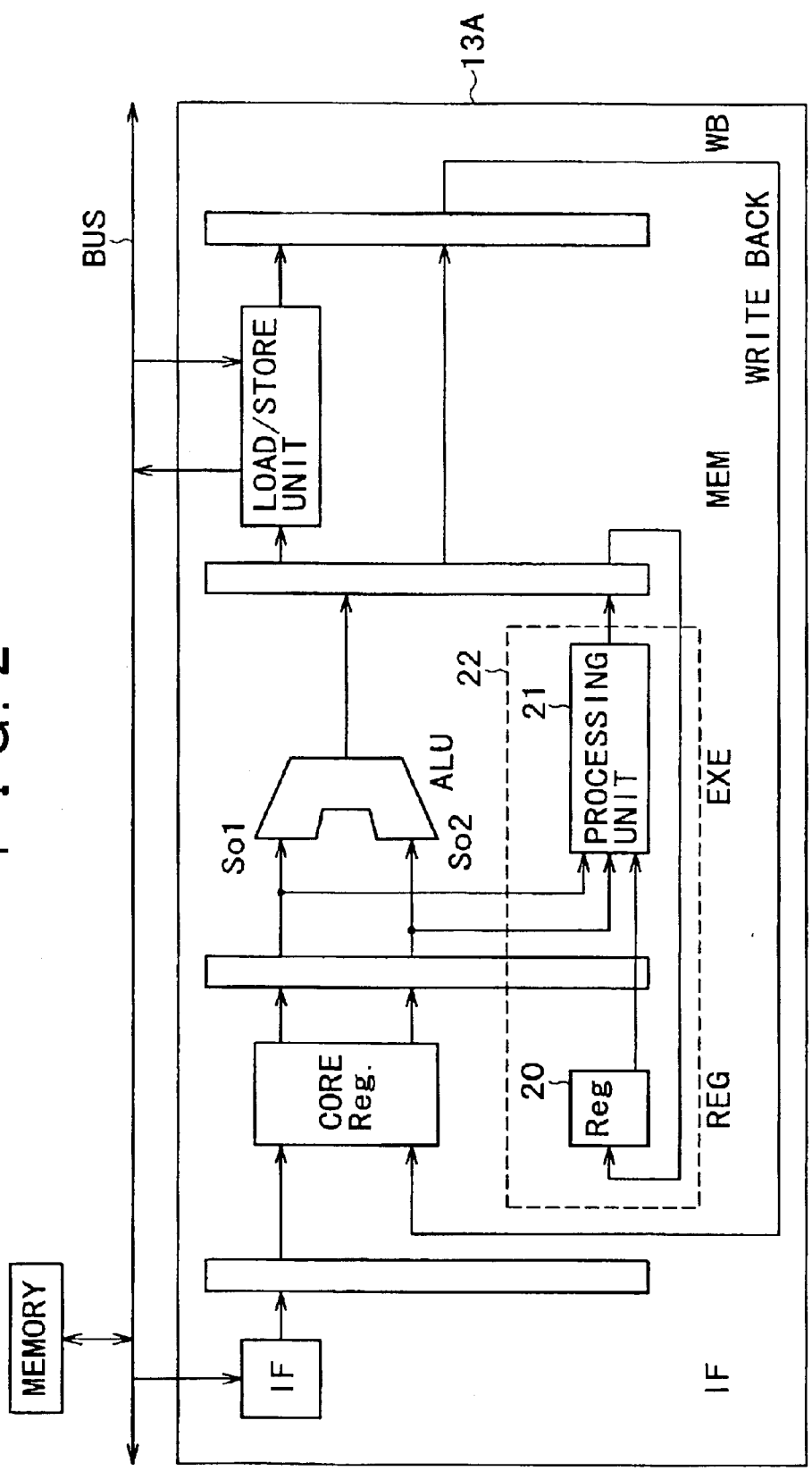
FIG. 2 is a block diagram showing a processor employed in the reproduction apparatus shown in FIG. 1.
Figure 22:
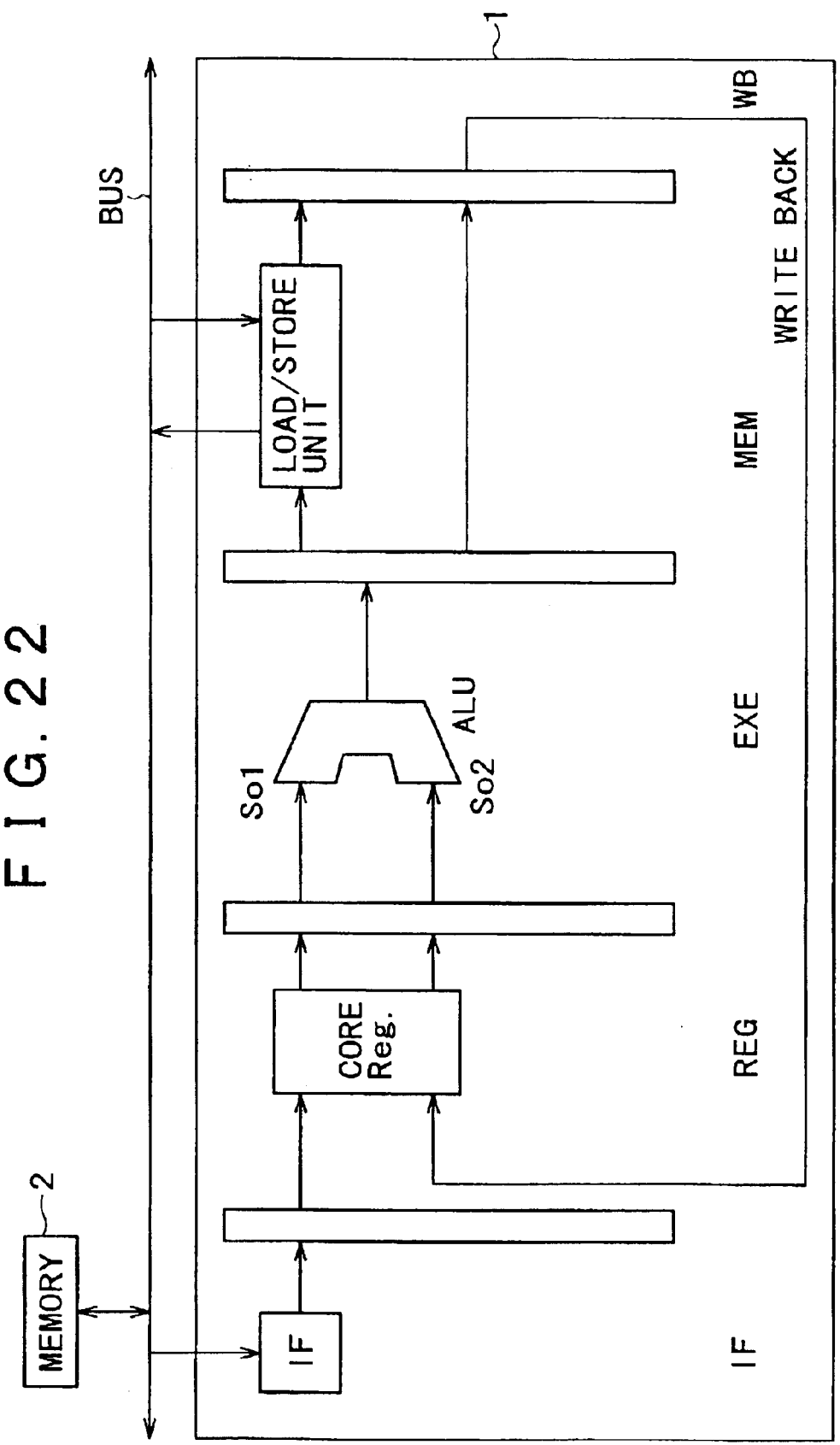
FIG. 22 is a block diagram showing the conventional processor.

FIG. 2 is a block diagram serving as a reference diagram of FIG. 22. The block diagram of FIG. 2 shows a configuration including the processor 13A and its peripherals. The processor 13A includes a dedicated register 20 at the REG stage and a processing unit 21 at the EXE stage. The dedicated register 20 and the processing unit 21 form an additional processing circuit 22. For such an additional configuration, an additional instruction is defined. By using the additional configuration and the additional instruction, the decoding process can be carried out at a high speed and a low power consumption. In addition, this additional configuration can be realized as a circuit with a small size without changing the basic configuration of the processor 13A. Thus, the additional configuration and the additional instruction can be provided for a variety of processors with ease.

Figure 3:
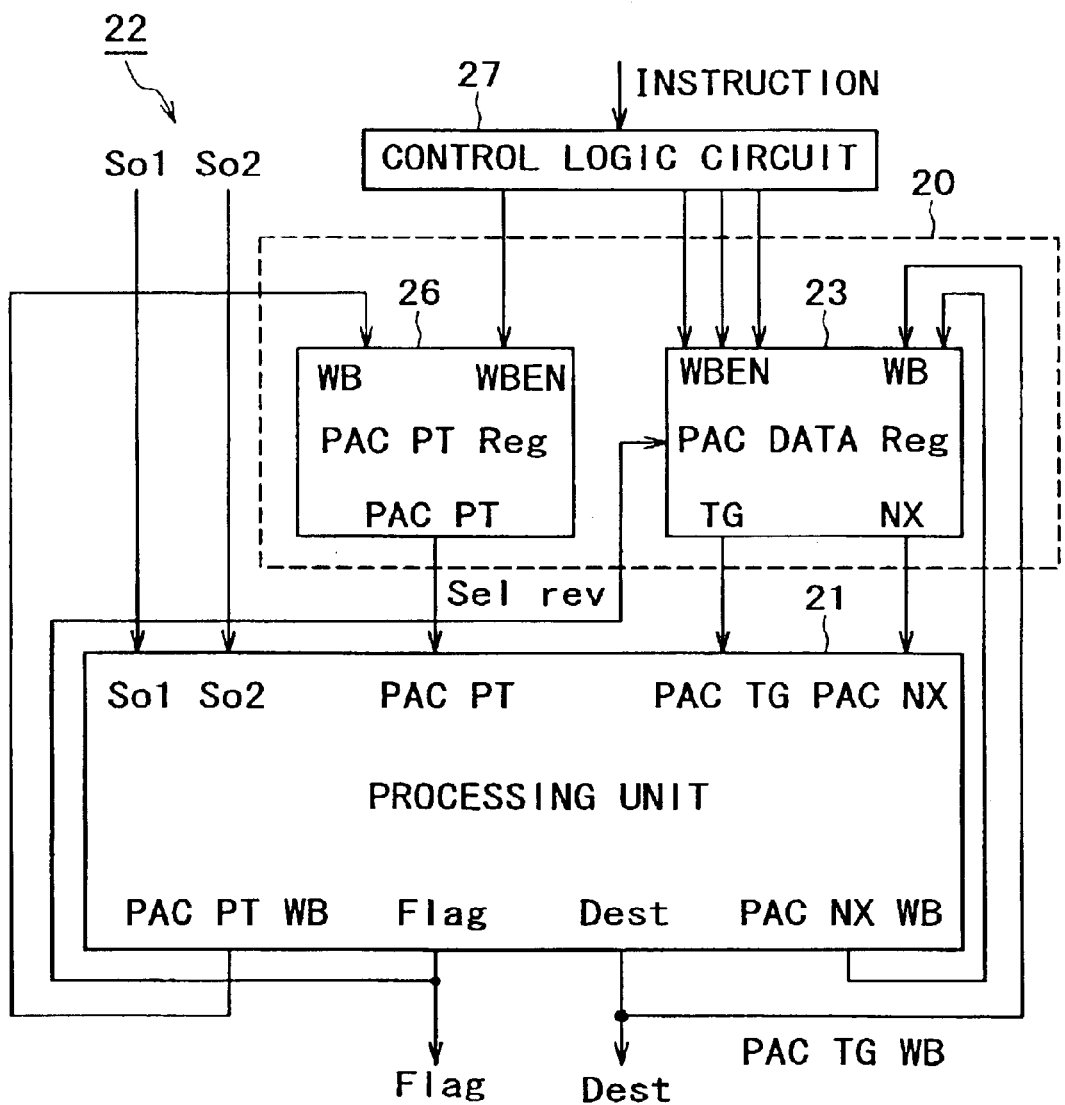
FIG. 3 is a block diagram showing a processing circuit employed in the processor shown in FIG. 2.
Figure 4:
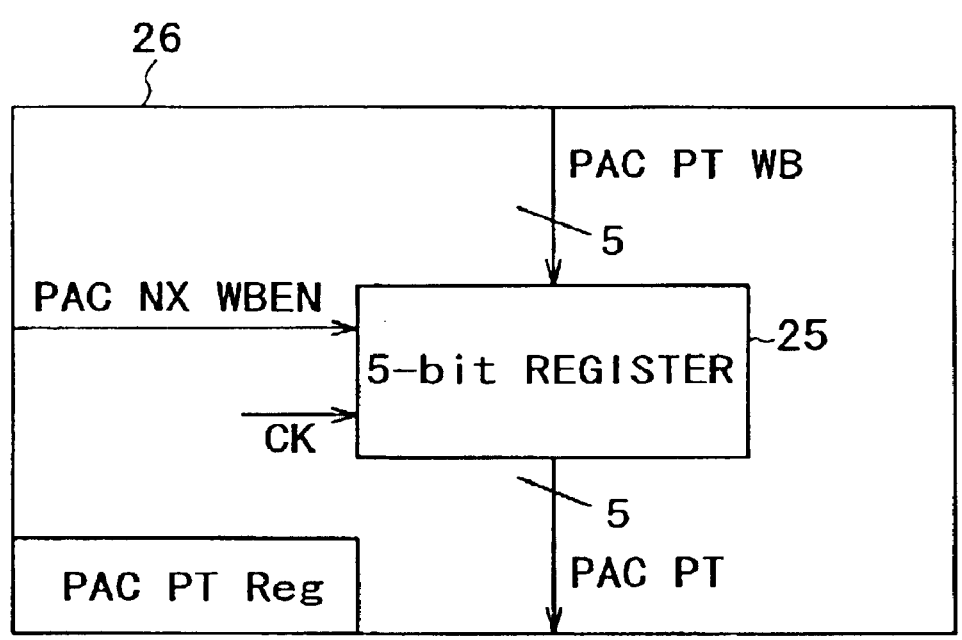
FIG. 4 is a block diagram showing a register for storing a pointer of the processing circuit shown in FIG. 3.

FIG. 3 is a block diagram showing the configuration of the processing circuit 22. The dedicated register 20 includes a PAC DATA register 23 and a PAC PT register 26. The PAC DATA register 23 is a register for holding data being processed. On the other hand, the PAC PT register 26 is a register for holding a pointer pointing to the data being processed. As shown in FIG. 4, the PAC PT register 26 is a 5-bit register 25 controlled by a control logic circuit 27.

Figure 5:
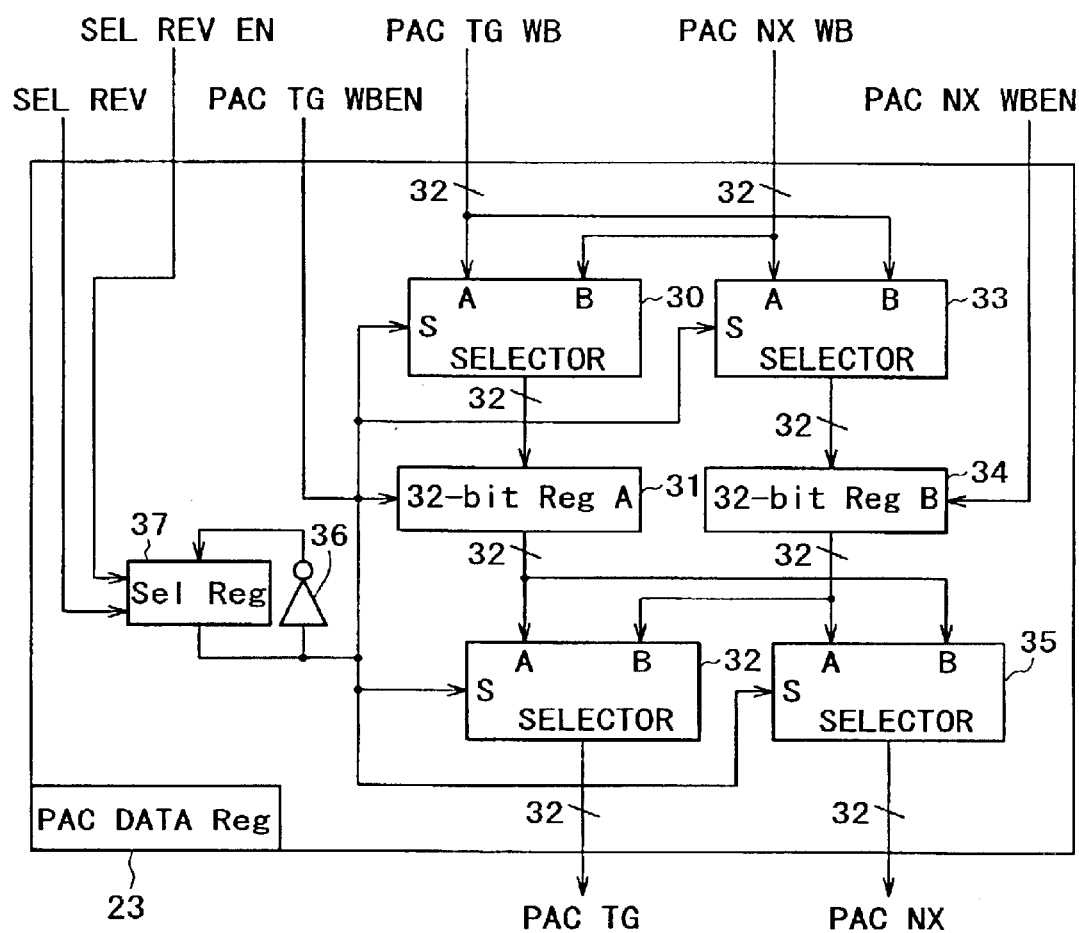
FIG. 5 is a block diagram showing data registers employed in the processing circuit shown in FIG. 3.

On the other hand, the PAC DATA register 23 includes a selector 30, an A register 31, and a selector 32 as shown in FIG. 5. The selector 30 is a main selector for selecting one of two pieces of data, namely, PAC TG WB, and PAC TG NX, which are output by the processing unit 21. The A register 31 is a 32-bit register for temporarily holding data selected and output by the selector 30. The selector 32 is a selector for selecting the output of the A register 31 or the output of a B register 34 and passing on the selected output to an input PAC TG of the processing unit 21. With the above configuration, the PAC DATA register 23 is capable of holding either PAC TG WB or PAC TG NX in the A register 31 and outputting a result of processing to the input PAC TG of the processing unit 21.

In addition, the PAC DATA register 23 includes a selector 33, a B register 34, and a selector 35 as shown in FIG. 5. The selector 33 is an auxiliary selector for selecting one of the two pieces of data, namely, PAC TG WB and PAC TG NX, which are output by the processing unit 21. The 32-bit B register 34 is an auxiliary register for temporarily holding data selected and output by the selector 33. The selector 35 is a selector for selecting the output of the B register 34 or the output of the A register 31 and passing on the selected output to an input PAC NX of the processing unit 21. With the above configuration, the PAC DATA register 23 is capable of holding either PAC TG WB or PAC TG NX in the B register 34 and outputting a result of processing to the input PAC NX of the processing unit 21. The selectors 33 and 35 provided for the B register 34 select an input complementary to the selectors 30 and 32 provided for the A register 31. Thus, in the PAC DATA register 23, data not held in the A register 31 is complementarily stored in the B register 34. In addition, by properly controlling the selectors 30, 32, 33, and 35, pieces of data input to or output by the A register 31 and the B register 34 can be switched over to each other.

It is to be noted that the PAC DATA register 23 also includes an inverter 36 for inverting the polarity of control data PAC TG WBEN supplied to the selectors 30 and 31 and other components. The PAC DATA register 23 also has a register 37 for temporarily storing the control data PAC TG WBEN with an inverted polarity.

Figure 6:
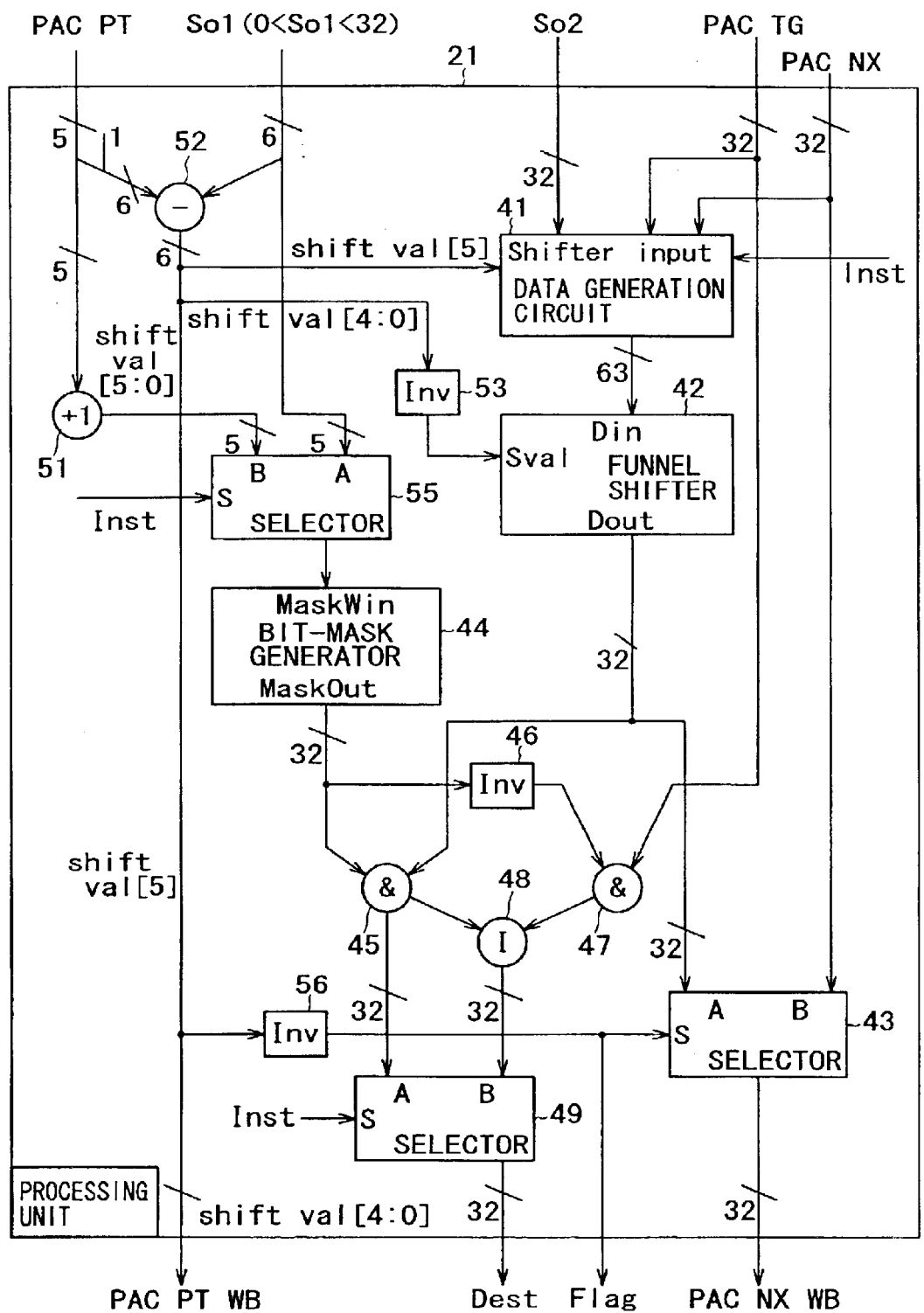
FIG. 6 is a block diagram showing a processing unit employed in the processing circuit shown in FIG. 3.
Figure 8:
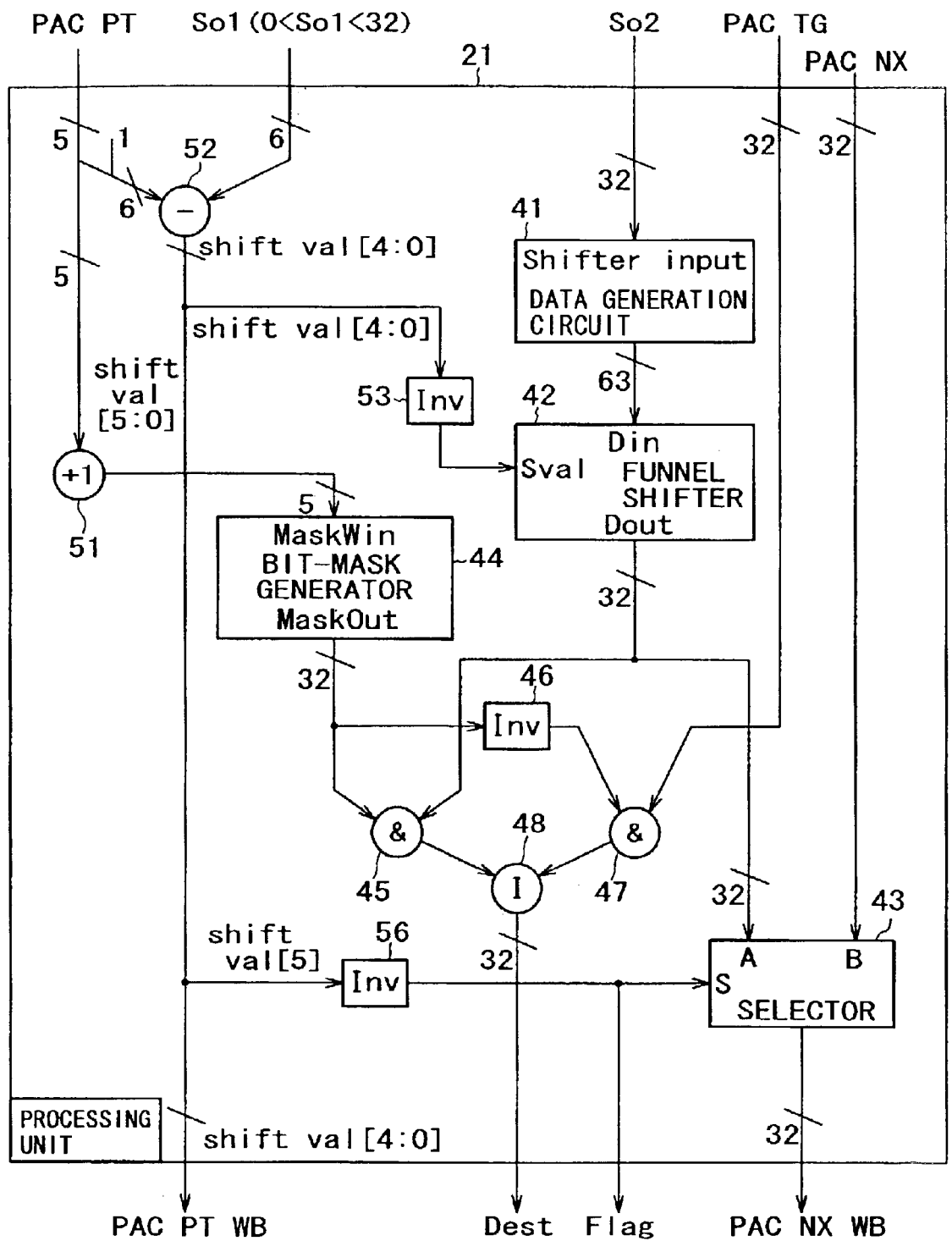
FIG. 8 is a block diagram showing a packing-process configuration of the processing unit shown in FIG. 6.

On the other hand, the processing unit 21 has a configuration shown in FIG. 6. The configuration of the processing unit 21 is a configuration common to the packing, unpacking, and clipping processes. FIG. 7 is a diagram showing only selected components of the configuration shown in FIG. 6 that are used for the unpacking process. On the other hand, FIG. 8 is a diagram showing only selected components of the configuration shown in FIG. 6 that are used for the packing process. The processing unit 21 has a data generation circuit 41, a funnel shifter 42, and a selector 43. The data generation circuit 41 is a component for selecting selectively an input bit stream or data output by the PAC DATA register 23 and outputting the selected data. The data generation circuit 41 also works as a component for properly concatenating the inputs supplied to the data generation unit 41 and outputting data obtained as a result of concatenation. The funnel shifter 42 is a component for bit-shifting data output by the data generation circuit 41 and outputting a 32-bit result of shifting. The selector 43 is a component for selecting the data output by the funnel shifter 42 or data PAC NX output from the B register 34 and outputting the selected one to the PAC DATA register 23. Thus, the processing unit 21 is capable of inputting and processing an input bit stream or encoded data as an object of processing and re-inputting a result of processing by way of the PAC DATA register 23.

In execution of a barrel shifter instruction, the funnel shifter 42 is capable of processing 64-bit input data obtained as a result of concatenation of 32-bit pieces of input data. That is to say, the funnel shifter 42 can also be shared by a barrel shifter instruction. In an unpacking process, however, even a 63-bit input is sufficient. Thus, the following description is based on a 63-bit input obtained by ignoring the most significant bit of the input. It is to be noted that a barrel shifter instruction outputs 33 bits.

The processing unit 21 includes a bit-mask generator 44, an AND circuit 45, an inverter 46, an AND circuit 47, an OR circuit 48, and a selector 49. The bit-mask generator 44 is a component for making a mask for data output by the funnel shifter 42. The AND circuit 45 is a component for masking the data output by the funnel shifter 42 by using a mask generated by the bit-mask generator 44. The inverter 46 is a component for inverting a mask generated by the bit-mask generator 44. The AND circuit 47 is a component for masking the data PAC TG output by the A register 31 of the PAC DATA register 23 by using an inverted mask produced by the inverter 46. The OR circuit 48 is a component for outputting a logical sum of data produced by the AND circuit 45 and data produced by the AND circuit 47. The selector 49 is a component for selecting either the data produced by the AND circuit 45 or data produced by the OR circuit 48.

With the configuration described above, in a clipping or unpacking process, the processing unit 21 concatenates data output from the A register 31 with data output from the B register 34 and supplies the result of the concatenation to the funnel shifter 42. The funnel shifter 42 selectively outputs 32-bit continuous data, which is then masked to extract a code of encoded data from the bit stream. In a packing process, on the other hand, data output from the A register 31 and data input to the processing unit 21 are masked before being subjected to a logical-sum process, which concatenates variable-length codes. In addition, in these processes, the processing unit 21 is capable of re-inputting the data output by the funnel shifter 42 by way of the PAC DATA register 23 after the data has been masked. Furthermore, the processing unit 21 is capable of re-inputting masked data by way of the PAC DATA register 23 in the same way.

Moreover, the processing unit 21 also includes an adder 51, a subtractor 52, an inverter 53, a selector 55, and an inverter 56. The adder 51 is a component for correcting the pointer PAC PT pointing to a bit position, at which processing is to be started, by adding the value of 1 to the pointer PAC PT. The subtractor 52 is a component for making a correction by subtracting a bit count So1 from the pointer PAC PT after adding the logical value of 1 to the most significant bit of the pointer PAC PT. The bit count So1 is a width specified by the control logic circuit 27. The inverter 53 is a component for controlling the funnel shifter 42 in accordance with a correction result output by the subtractor 52. The selector 55 is a component for selecting either the corrected value output by the adder 51 or a value specified by the control logic circuit 27 and outputting the selected value to the bit-mask generator 44. The inverter 56 is a component for generating a flag from shift val [5] output by the subtractor 52 and controlling the selector 43. With the configuration described above, the processing unit 21 is capable of controlling a series of operations carried out by the funnel shifter 42 and pieces of data supplied to the operations during a packing or unpacking process.

For the configurations, three additional instructions are defined for the processor 13A. The three instructions include a clipping instruction ("clip") requesting a clipping process. In the clipping process requested by the clipping instruction, data having a specified width So1 is extracted from data stored in the PAC DATA register 23. The extracted data is output as an output Dest of the processing unit 21. The data is extracted starting with a bit at a position pointed to by a pointer PAC PT stored in the PAC PT register 26.

The three instructions also include an unpacking instruction ("upac") requesting an unpacking process. In the unpacking process requested by the unpacking instruction, data having a specified width So1 is extracted from data stored in the PAC DATA register 23. The extracted data is output as an output Dest of the processing unit 21. The data is extracted starting with a bit at a position pointed to by a pointer PAC PT stored in the PAC PT register 26. After the execution of the unpacking instruction, the pointer PAC PT is updated by a quantity equal to the width So1 of the extracted data. If the data to be extracted is spread over data stored in the A register 31 and the B register 34, a flag is set at 1 as a result of processing to swap the two inputs to each of the selectors 32 and 35. In addition, on the rising edge of this flag, the following bit stream is loaded into the B register 34 and the object being processed is switched to the following bit stream of 32 bits. It is to be noted that, in the processing unit 21, the pointer PAC PT has a width of 5 bits. If the object being processed is switched from the A register 31 to the B register 34, the pointer PAC PT points to a processing position in the data on the head side in the B register 34. Thus, the pointer PAC PT always points to a processing position in the data on the head side, which can be in the A register 31 or the B register 34.

In addition, the three instructions also include a packing instruction ("pac") requesting a packing process. In the packing process requested by the packing instruction, bit streams having different lengths are collected to form data with a size of 32 bits. In the packing process, data being processed is held in the PAC DATA register 23 and the pointer PC AT is updated for each process. As data with a size of 32 bits is formed as a result of the packing process, the processing unit 21 sets the flag at 1. The 32-bit data obtained as a result of the packing process is referred to as packed data Dest. If data cannot be collected, on the other hand, the processing unit 21 resets the flag at 0. In this case, the data Dest starting with a bit pointed to by the pointer PAC PT is not assured. It is to be noted that, if the processing unit 21 sets the flag at 1, the data stored in the B register 34 is transferred to the A register 31 and the next bit stream is loaded into the B register 34.

By doing the operations as described above, in the processor 13A, the control logic circuit 27 does not execute control to write back the pointer PAC PT into the pointer register 26 when the clipping instruction is executed, but executes control to write back the pointer PC PT into the pointer register 26 when the packing or unpacking instruction is executed. (Refer to FIG. 2.) The PAC DATA register 23 is updated by storing back data PAC TG, data PAC NX, or control data Se1 rev into the register 23 if necessary when the packing instruction is executed. When the unpacking instruction is executed, on the other hand, the PAC DATA register 23 is updated by storing back data PAC TG or PAC NX.

The A register 31, the B register 34, and the pointer register 25, which are included in the processor 13A, are defined as described above. It is to be noted that the A register 31, the B register 34, and the pointer register 25 can each be specified as a source register in an instruction. In this embodiment, a register specified in a load/store instruction can be mapped onto a memory location without much decreasing the processing speed.

As shown in FIGS. 7 and 9, in an unpacking process carried out by the processing unit 21, inputs are received from the A register 31, the B register 34, and the register 37. A specified width So1 is received from a core register (in a set of registers) embedded in the processor 13A. The received inputs are the 32-bit data PAC TG of the bit stream being processed, the following 32-bit data PAC NX and the pointer PAC PT. The core register is indicated by the output of a register specified by a source operand of the unpacking instruction. It is to be noted that, in the processing unit 21, the specified width So1 is a bit count of data to be extracted. In this embodiment, the specified width So1 has a value in the range 1 to 32. If necessary, however, a circuit can be added so that the specified width So1 can have a value beyond the range.

Let symbol A [31:0] used in the following description denote a bit array A having a width of 32 bits or consisting of bit 31 to bit 0. In addition, let symbol [[B [15:0], C [15:0]]] denote a result of concatenation of a bit array B and a bit array C with bit 0 of the bit array B followed by bit 15 of the bit array C. Furthermore, let symbol b1 denote a binary value having a width of 1 bit and symbol 1'b1 denote a 1-bit binary value of 1.

In the processing unit 21, the data PAC TG from the A register 31 is concatenated with the data PAC NX from the B register 34 as shown in FIG. 9A to produce data PAC DATA to be supplied to the funnel shifter 42. The pointer PAC PT points to the position of a first bit with which the current unpacking process is to be started. That is to say, the position of the data PAC DATA's first bit with which the current unpacking process is to be started is pointed to by [1'b1, PAC PT]. In the processing unit 21, the subtractor 52 subtracts the bit count So1 from the pointer PAC PT in accordance with the following equation:

$$\text{shift val } [5:0] = [1'b1, PAC\ PT] - So1 \qquad (1)$$

By carrying out the above subtraction, the processing unit 21 corrects the pointer PAC PT by a quantity equal to the number of bits extracted in the unpacking process. It is to be noted that, in the following description and figures, the corrected value of the pointer PAC PT is referred to as PAC PT'. The corrected pointer PAC PT thus points to the position of the first bit of the data PAC DATA after the unpacking process.

The most significant bit shift val [5] of the subtraction result shift val [5:0] thus indicates whether the corrected pointer PAC PT' points to the high-order 32 bits of the data PAC DATA supplied to the funnel shifter 42 or the low-order word of the data PAC DATA. That is to say, a value of shift val [5] equal to 1 indicates that a subsequent unpacking process can be carried out on the input data PAC DATA. On the other hand, a value of shift val [5] equal to 0 indicates that, in the subsequent unpacking process, the low-order word must be processed as is obvious from FIGS. 10A to 10D if seen in comparison with FIGS. 9A to 9D. In this embodiment, in this case, the data stored in the B register 34 is transferred to the A register 31 and the following bit stream is loaded into the B register 34. In this way, the object of processing is switched from one register to another. As a standard of such a series of processes, the processing unit 21 outputs the inverted value of shift val [5]. The inverted value of shift val [5] is generated by the inverter 56 as a flag.

For a value of shift val [5] equal to 0, shift val [4:0] obtained as described above indicates the position of the first bit of the word data PAC TG on the low-order word side to be subjected to the next processing as shown in FIG. 10A. For a value of shift val [5] equal to 1, on the other hand, shift val [4:0] indicates the position of the first bit of the word data PAC NX on the high-order word side to be subjected to the next processing as shown in FIG. 9A. Thus, with the flag set at 1, the data stored in the B register 34 is transferred to the A register 31. As a result, shift val [4:0] always indicates the position of the first bit of the word data PAC TG. The processor 13A stores back shift val [4:0] in the register 25 as PAC PT WB.

During the operation to transfer the data stored in the B register 34 to the A register 31 as described above, in the data register 23, the data stored in the B register 34 is transferred to the A register 31. Then, in a series of subsequent processes, the following bit stream is loaded into the B register 34. In this way, the processor 13A is capable of extracting correct data to be processed from the bit stream and processing the extracted data.

In addition, in the processing unit 21, the funnel shifter 42 carries out processes including an operation to select one of low-order bits in dependence on the value of shift val [4:0]. Let symbol Sval [4:0] denote the value of shift val [4:0]. For Sval=0, the funnel shifter 42 outputs Din [31:0]. For Sval= 31, on the other hand, the funnel shifter 42 outputs Din [62:31]. In general, for Sval=N, the funnel shifter 42 outputs Dout (=Din [31 +N:N]).

That is to say, for shift val [5]=1, data to be unpacked is all in PAC TG on the high-order side as shown in FIG. 9A. In this case, the funnel shifter 42 shifts the data in the right direction by a bit count determined by the start position of bits subjected to the next unpacking process to generate an output as shown in FIGS. 9B and 9C. By doing this operation, in the processing unit 21, the bit-mask generator 44 generates a mask having the same width as the portion extracted in the unpacking process. The mask is then used for masking the data output by the funnel shifter 42 as shown in FIG. 9D.

For shift val [5]=0, on the other hand, PAC TG on the high-order side and PAC NX on the low-order side are both required. In this case, shift val [4:0] points to the next bit start position in PAC NX on the low-order side. Also in this case, the data with a size indicated by the pointers PAC PT and PAC PT' is shifted in the right direction till the LSB of the necessary data coincides with bit 0 as shown in FIGS. 10B and 10C. In addition, in the processing unit 21, the right-shifted data is masked as shown in FIG. 10D.

A mask is created in accordance with the following rules:

MaskWin=N

For N>0,

MaskOut=[[(32−$N$)[1$'b$0 ]], [($N$)[1$'b$1]]]

For N=0,

MaskOut=32$'h$ffff ffff     (2)

Thus, for an So1 value of 4, data with bits 0 to 4 set at 1 and the remaining bits reset to 0 is output. As a result, the processing unit 21 obtains output data expressed by the following equation through the AND circuit 45:

Dest [31:0]=MaskOut & Dout (FIGS. 9A to 9D (11))     (3)

Thus, in this processor 13A, by combining an unpacking instruction with a clipping instruction, it is possible to output data (Dest) with a maximum code length. This data is masked into a final extracted portion having a code length obtained by referencing a lookup table 19A or 19B. This series of processes is carried out repeatedly to implement the decode processing.

Figure 11:
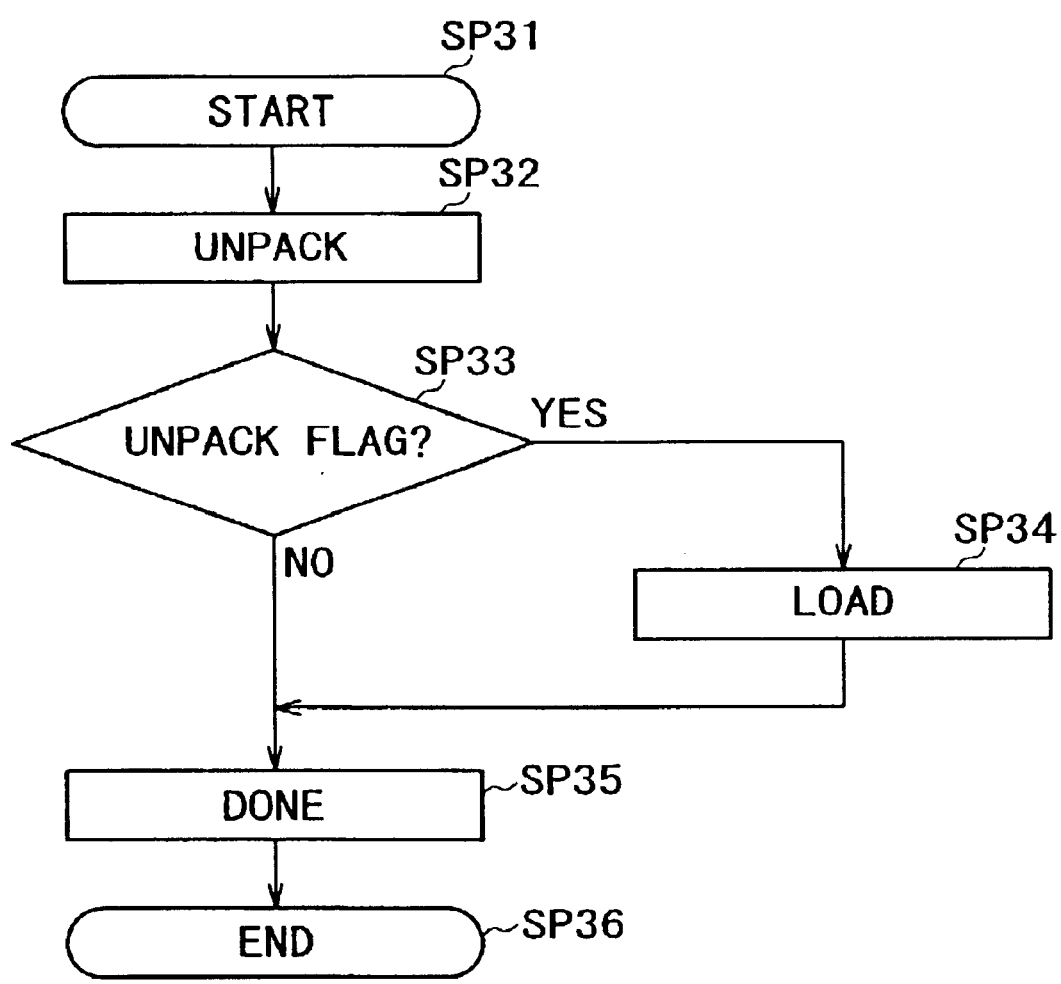
FIG. 11 shows an explanatory flowchart representing the unpacking process carried out in the configuration shown in FIG. 7.

FIG. 11 shows a flowchart representing a typical application of the unpacking instruction. It is to be noted that, as a precondition for execution of the unpacking instruction, pieces of data each having a length of N bits, where N=32, have been sequentially loaded into the A register 31 and the B register 34. The processing procedure represented by the flowchart shown in FIG. 11 starts with a step SP31. Then, at the next step SP32, an unpacking instruction is issued. The unpacking instruction specifies Num as the number of bits to be extracted from the bit stream. The execution of the issued unpacking instruction is completed in a cycle. The result of the processing is stored in a register. If the data to be processed next is spread over the A register 31 and the B register 34, the flag is set.

Then, the flow of the processing goes on to a step SP33 to form a judgment whether or not the flag has been set. If the flag has been set, the data stored in the B register 34 is transferred to the A register 31. Then, at the next step SP34, the following data is loaded into the B register 34. Subsequently, at the next step SP35, output data is obtained if necessary. Finally, at the next step SP36, the execution of the processing procedure is ended. If the flag has been reset, on the other hand, the flow of the processing continues from the step SP33 to the step SP35. In actuality, a load instruction is executed at the step SP34 only if the outcome of the judgment formed at the step SP33 indicates that the flag has been set. Thus, in this branch processing, the execution can be accomplished without relaying on a branch instruction so that the processing can be carried out at a higher speed due to the absence of a branch instruction.

If the processing is to be carried out continuously, the flow of the processing goes back from the step SP35 to the step SP32 to repeat the processing.

FIG. 12 shows a typical actual program including an unpacking instruction. This program fetches data from a bit stream in 32-bit units and then extracts 7-bit portions from the fetched data and outputs the 7-bit portions. The instructions on fourth to eighth lines of the program constitute an initialization to load data into the A register 31 and the B register 34. By carrying out the initialization in this way, in the subsequent processing, that is, in the processing consisting of the instructions on the twelfth to fifth lines, the next data needs to be loaded only if the flag has been set without the need to be aware of the processing position. Thus, the processing can be carried out at a high speed. By the way, this processing assures that the data obtained by the instruction on the 10th line is packed to the right end, that is, packed so that its LSB coincides with the right end, and the high-order bits of the data are each clear to 0. Thus, in processing such as a decoding process, this value is used to reference a table immediately after and data fetched from the table is used in the processing.

Figure 13:
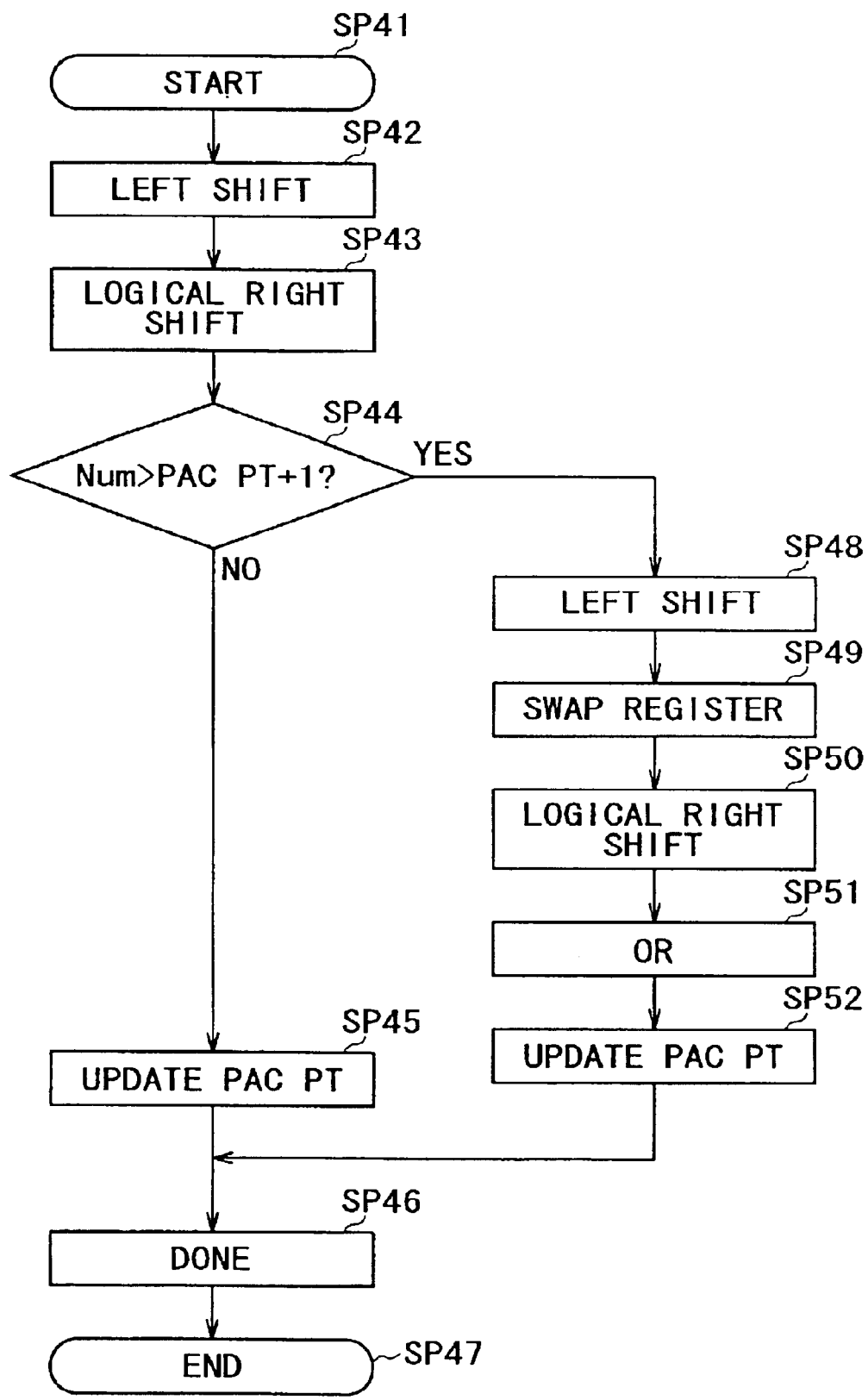
FIG. 13 shows an explanatory flowchart used for describing a process represented by the flowchart shown in FIG. 11 for the purpose of comparison with the conventional processing.
Figure 23:
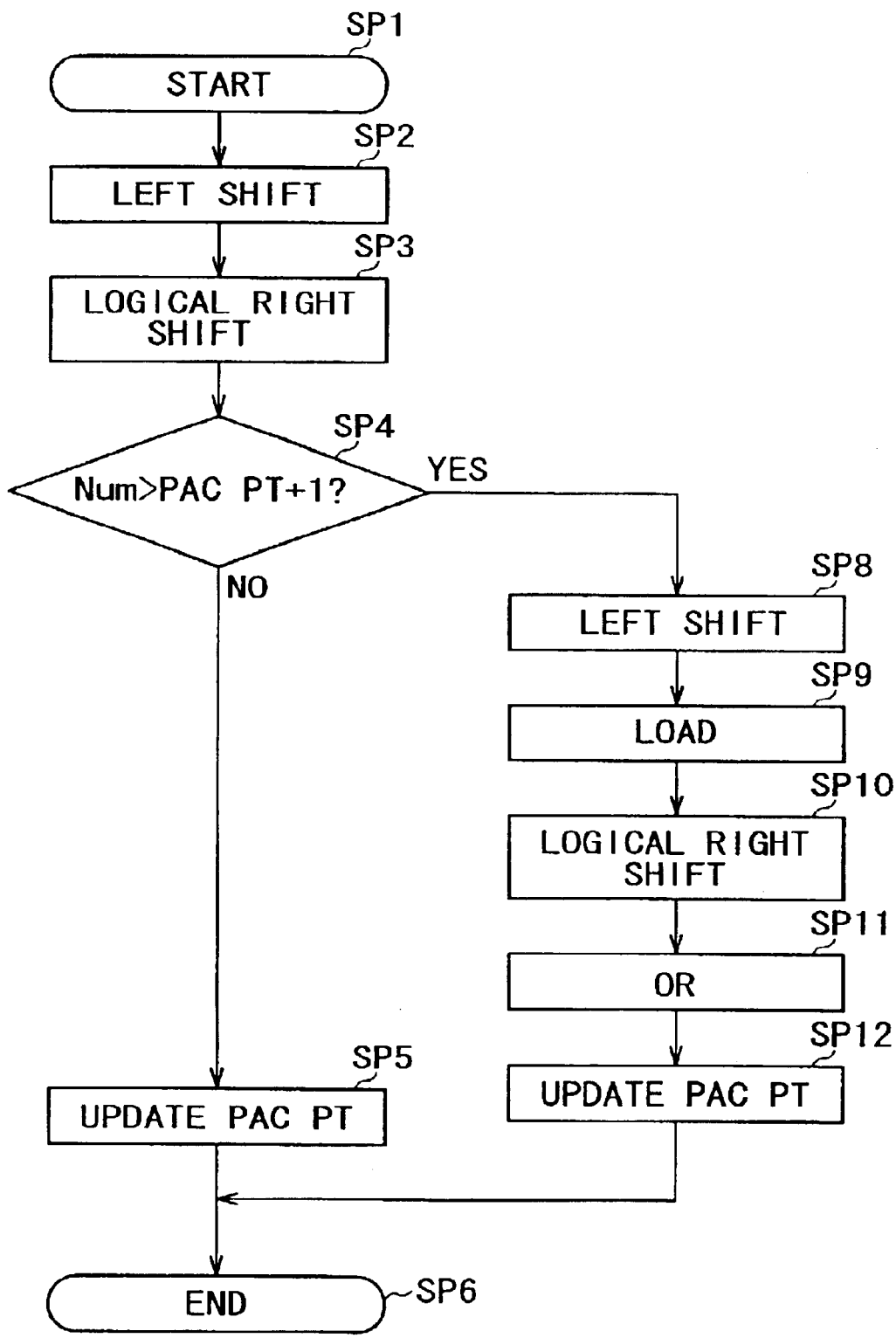
FIG. 23 shows an explanatory flowchart representing the conventional unpacking process.

FIG. 13 shows a flowchart representing a series of processes carried out by the processor 13A. This flowchart is a flowchart representing a processing procedure to be referred to in comparison with the flowchart shown in FIG. 23. It is to be noted that, even though the flowchart representing the processing of the processor 13A as shown in FIG. 13 is provided for the purpose of comparison with the flowchart shown in FIG. 23, the flowchart shown in FIG. 13 does not directly correspond to the configuration described above. Registers REG X1 and REG X2 cited in the following description are registers used in an intermediate process. In addition, it is assumed that a bit stream has been stored in the A register 31 and the B register 34 in advance. The flowchart representing the processing of the processor 13A as shown in FIG. 13 starts with a step SP41. Then, at the next step SP42, the data PAC TG stored in the A register 31 is shifted in the left direction by (N-PAC PT−1) bits so that the first one of the bits to be extracted coincides with the MSB. The result of this processing is stored in the intermediate-processing register REG X1. In addition, bit streams have been stored in the A register 31 and the B register 34 in advance.

Then, at the next step SP43, the data stored in the intermediate-processing register REG X1 is logically shifted in the right direction by (N-Num) bits so that the last one of the bits to be extracted coincides with the LSB.

Subsequently, the flow of the processing goes on to the next step SP44 to compare the pointer PAC PT stored in the pointer register 26 with Num in order to form a judgment whether or not Num is greater than PAC PT where symbol Num denotes the number of bits to be extracted. If the number (Num) of bits to be extracted is smaller than the pointer PAC PT stored in the pointer register 26, the flow of the processing goes on to a step SP45. At this step, the pointer PC AT is updated to a value equal to (PAC PT−Num) to indicate that Num bits have been extracted and the value of (PAC PT−Num) is stored in the pointer register 26. Then, at the next step SP46, the contents of the intermediate-processing register REG X1 are trimmed to Num bits and a result of trimming is output. Finally, at the next step SP47, the execution of the processing is ended.

If the number (Num) of bits to be extracted is greater than the pointer PAC PT stored in the pointer register 26, on the other hand, the flow of the processing goes on from the step SP44 to a step SP48. At this step, the data stored in the intermediate-processing register REG X1 is shifted in the left direction by (N-Num−1) bits corresponding to the number of bits to be extracted. Then, at the step SP49, the flag is set. In addition, the data stored in the B register is transferred to the A register 31 and the next bit stream is loaded into the B register 34. Subsequently, at the next step SP50, the data stored in the A register 31 is logically shifted in the right direction by (N-Num) bits and the right-shifted data is stored in the intermediate-processing register REG X2.

Then, at the next step SP51, the data stored in the register REG X1 and the data stored in the register REG X2 are subjected to a logical sum (OR) process to concatenate the data stored in the register REG X1 with the data stored in the register REG X2 and data obtained as a result of the concatenation process is stored in the register REG X1. At the next step SP52, the pointer PC AT is updated to a value equal to (N-PAC PT+Num) to indicate that Num bits have been extracted and the value of (PAC PT−Num) reflecting the extraction of Num bits is stored in the pointer register 26. The flow of the processing then goes on to the step SP46.

In the processor 13A, the processes of the steps SP43, SP45, and SP48 to SP52 are carried out by the hardware of the processing circuit 22. To be more specific, the processes are performed as bit-shift processing in the funnel shifter 42 and a series of masking processes. As a result, the processes can be carried out at a considerably high speed in comparison with the conventional apparatus.

As shown in FIGS. 8, 14, and 15, in the case of a packing instruction, on the other hand, the processor 13A inputs data So2 to be packed from a core register (of a register set) to the funnel shifter 42 and writes back a previously fetched bit array PAC TG into the A register 31 serving as a register for saving the bit array. Then, the data So2 is bit-shifted by the funnel shifter 42 and masked by the AND circuit 45. In addition, the data PAC TG is masked by the AND circuit 47. The outputs of the AND circuits 45 and 47 are subjected to a logical-sum process in the OR circuit 48 to concatenate the masked data So2 with the masked data PAC TG.

In these processes, the processor 13A supplies the data So2 to the funnel shifter 42 repeatedly to be held in the funnel shifter 42 as shown in FIGS. 14A and 14B. In addition, a position at which the packing process is to be started is indicated by the pointer PAC PT. If the pointer PAC PT has such a value that size of data obtained as a result of the packing process is smaller than 32 bits, the data is written back into the A register 31 serving as a register for saving the data as shown in FIGS. 14A to 14D. If the size of data obtained as a result of concatenation of So2 and PAC TG is greater than 32 bits, on the other hand, the funnel shifter 42 is used for carrying out a bit-shifting process on the data So2 and the data So2 is concatenated with the data PAC TG to produce a result of 32 bits. In addition, by supplying the data So2 to the funnel shifter 42 repeatedly, data output by the funnel shifter 42 can be saved in the B register 34 by way of the selector 32. Then, the contents of the B register 34 are transferred to the A register 31 as shown in FIGS. 15A to 15E. In this way, the remaining portion of the data So2 can be held in the A register 31.

That is to say, in this case, the processor 13A initializes the pointer PAC PT at a value indicating the position of the first bit with which the concatenation of the data held in the A register 31 is to be started. Then, other data So2 to be concatenated is received from a core register (of a register set) embedded in the processor 13A. The other data So2 has a width of So1. Subsequently, the subtractor 52 carries out a subtraction according to Eq. (1). As a result of these operations, after the concatenation process, shift val [5:0] points to the position of a start bit with which the concatenation of the subsequent data is to be started. Refer to FIGS. 14C and 14D.

Thus, for shift val [5]=0, all the 32 bits of the data Dest can be obtained in a single packing process as a result of concatenation of the data So2 with the data PAC TG. In this case, the data So2 is all used up or used partially, leaving a residue. For shift val [5]=1, on the other hand, the data PAC TG packed so far and the data So2 to be packed this time are not enough for creating a word. In this case, the processor 13A inverts the value of shift val [5] and outputs the inverted value as the flag as is the case with the unpacking process. Also much like the unpacking process, shift val [4:0] is output to the data register 23 as PAC PT WB and the data stored in the B register 34 is transferred to the A register 31.

On the other hand, in a bit-shift operation using the funnel shifter 42 to shift the data So2 prior to a process of concatenating the shifted data So2 with the data PAC TG held in the A register 31, it is necessary to take the first bit of the data So2 to a position pointed to by the pointer PAC PT. For shift val [5]=1, the concatenation process will not produce a result having a size of 32 bits. In order to solve this problem, that is, in order to produce a concatenation result having a size of 32 bits by merely shifting the data So2 so as to take the first bit of the data So2 to a position pointed to by the pointer PAC PT and then concatenating the shifted data So2 with the data PAC TG held in the A register 31, it is necessary to shift the data So2 so that Din [31] coincides with a position pointed to by shift val [4:0] (=N−x) where symbol N denotes the value of the pointer PAC PT, symbol x denotes the bit count So1 and symbol Din [31] denotes bit 31 of Din=[S02 [30:0], So2 [31, 0]], which is data input to the funnel channel 42. That is to say, the bit count by which data in the funnel shifter 42 is shifted is expressed by the following equation.

$$31-(N-x)=-1-\text{shift val }[4:0]=\sim\text{shift val }[4:0] \qquad (4)$$

Thus, unlike the unpacking process, shift val [4:0] is inverted by the inverter 53 and the inverted value is used as Sval of the funnel inverter 42 as shown in FIGS. 14A and 14B. For shift val [5]=0, on the other hand, it is also necessary to shift the data So2 so that Din [31 ] coincides with a position pointed to by shift val [4:0] (=N−x) in the same way as shown in FIGS. 15A and 15B. Thus, the bit count by which data in the funnel shifter 42 is shifted is also the inverted value of shift val [4:0].

Thus, in the processor 13A, the funnel shifter 42 outputs data Dout shown in FIG. 14B. As shown in the figure, in the output data Dout, the most significant bit of the shifted data So2 to be packed coincides with the Nth bit from the start. In addition, for shift val [5]=0, in the data Dout output by the funnel shifter 42, data to be carried over to the next processing is left in the high-order bits and the most significant bit of the shifted data So2 coincides with the Nth bit from the start as shown in FIG. 15B. Then, the data Dout output by the funnel shifter 42 is masked and concatenated with the data PAC TG output from the A register 31 to obtain the packed data Dest as shown in FIGS. 15D and 15E. In addition, the data Dout output by the funnel shifter 42 is stored back into the A register 31 to be used in the next packing process as shown in FIG. 15C.

In a masking process, on the other hand, it is necessary to clear each of low-order bits of the data PAC TG output from the A register 31 to 0. The low-order bits start with a bit pointed to by the pointer PAC PT and end with the least significant bit. On the other hand, it is necessary to clear each of high-order bits of the data Dout output from the A funnel shifter 42 to 0. The high-order bits start with the most significant bit and end with a bit following a bit pointed to by the pointer PAC PT, that is, a bit pointed to by (PAC PT+1).

In the processor 13A, a mask MaskOut having a width of (PAC PT+1) bits is generated by the bit-mask generator 44 to be used to clear the high-order bits of the data Dout output from the funnel shifter 42 to 0 as described above. Then, the mask is inverted by the inverter 46 to be used to clear the low-order bits of the data PAC TG output from the A register 31 to 0 as described above. The concatenation process is expressed by the following equation:

Dest=(Dout & MaskOut)|(PAC TG & ~MaskOut)

where symbol Dest denotes the result of the concatenation process and symbol MaskOut denotes MaskOut's inverted value output by the inverter 46.

It is to be noted that, in an operation to renew the contents of the B register 34, the data Dout output by the funnel shifter 42 is stored back into the B register 34 by changing over the input to the selector 43 from one to another only if the flag has been set.

Thus, for Flag=0 or shift val [5]=1, (N−x) bits or fewer bits of the data Dest output by the processor 13A are not assured. For Flag=1 or shift val [5]=0, on the other hand, all bits of the data Dest output by the processor 13A are assured. For this reason, the output data Dest is acquired selectively on the rising edge of the flag in order to obtain a result of the processing. It is to be noted that a processing intermediate result can also be output to simplify the whole configuration of this embodiment. In addition, the configuration of the processor 13A can also be applied to a decoding process.

FIG. 16 shows a typical actual program using a packing instruction to carry out a process to pack 7-bit portions into a 32-bit unit. This process to pack 7-bit portions into a 32-bit unit is the inverse of the process represented by the program shown in FIG. 12. As shown in the instruction on the third line of this program, data at the head is loaded initially into the A register 31 as initialization. Then, by execution of instructions on the fifth to ninth lines, pieces of data to be packed are loaded sequentially without the need to be aware of the processing position. Only if the flag is set, output data is acquired and stored in a memory. In comparison with the conventional processing, complex bit-shift, masking, and AND and OR operations are not required. As a matter of fact, the packing process can be carried out at a speed several times the speed of the conventional processing.

On the other hand, a clip process is a process of extracting data So1 having a specified width measured with the pointer PAC PT used as a standard from the PAC DATA register 23 as is the case of the unpacking instruction. However, the clip process is different from the process of the unpacking instruction in that, in the case of the clip process, the pointer PC PT is not updated and there is no change-over operation to transfer data stored in the B register 34 to the A register 31. Thus, in the clip process, the processor 13A carries out the same processing as the unpacking instruction except the operation to update the pointer PAC PT and the change-over operation to transfer data stored in the B register 34 to the A register 31.

Figure 17:
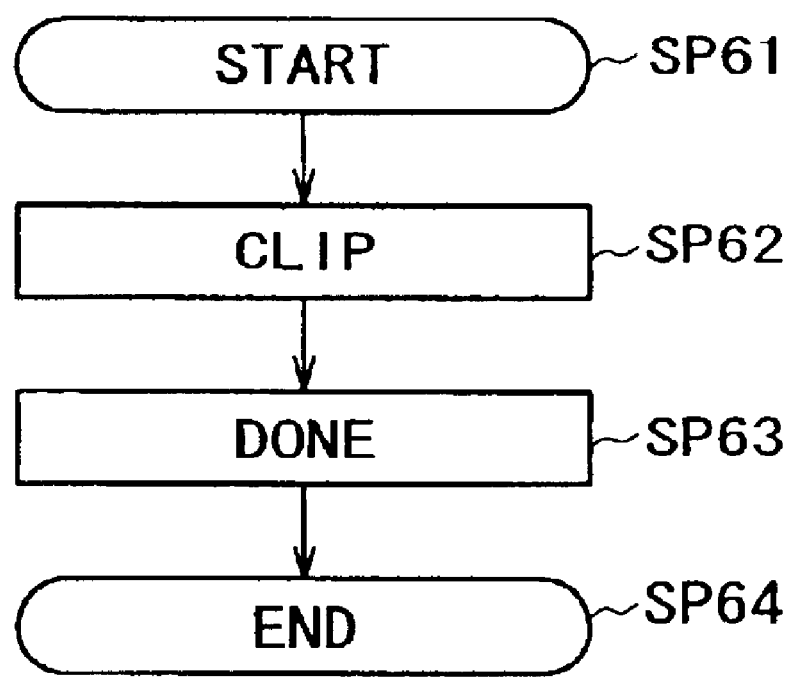
FIG. 17 shows an explanatory flowchart representing a clipping instruction.

As a comparison with the flowchart shown in FIG. 11, FIG. 17 shows a flowchart representing a typical application of a clipping instruction. It is to be noted that, as a precondition for execution of the clipping instruction, pieces of data each having a length of N bits, where N=32, have been sequentially loaded into the A register 31 and the B register 34. The processing procedure represented by the flowchart shown in FIG. 17 starts with a step SP61. Then, at the next step SP62, a clipping instruction is issued. The clipping instruction specifies Num as the number of bits to be extracted from the bit stream. The execution of the issued clipping instruction is completed in a cycle. The result of the processing is stored in a register at the next step SP63. If the data to be processed next is spread over the A register 31 and the B register 34, the flag is set. Then, the flow of the processing goes on to the last step SP64 to complete the processing in a cycle.

Figure 18:
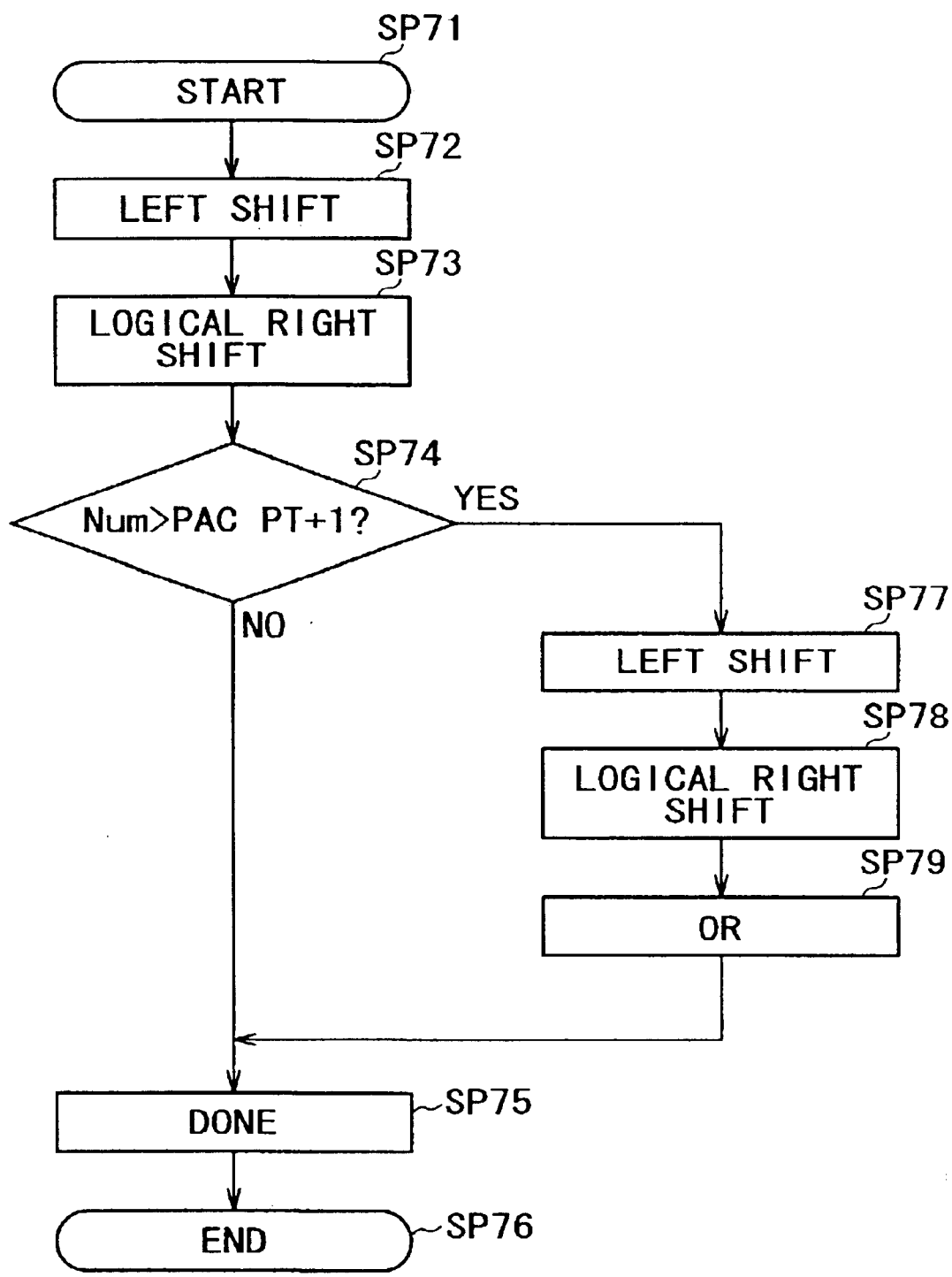
FIG. 18 shows an explanatory flowchart used for describing a process represented by the flowchart shown in FIG. 17 for the purpose of comparison with the conventional processing.

FIG. 18 shows a flowchart representing a series of processes carried out by the processor 13A. This flowchart is a flowchart representing a processing procedure to be referred to in comparison with the flowchart shown in FIG. 23. It is to be noted that, even though the flowchart representing the processing of the processor 13A as shown in FIG. 18 is provided for the purpose of comparison with the flowchart shown in FIG. 23, the flowchart shown in FIG. 18 does not directly correspond to the configuration described above as is the case with the flowchart shown in FIG. 13. Registers REG X1 and REG X2 cited in the following description are registers used in an intermediate process. In addition, it is assumed that a bit stream has been stored in the A register 31 and the B register 34 in advance.

The flowchart shown in FIG. 18 starts with a step SP71. Then, at the next step SP72, the data PAC TG stored in the A register 31 is shifted in the left direction by (N-PAC PT−1) bits so that the first one of the bits to be extracted coincides with the MSB. The result of this processing is stored in the intermediate-processing register REG X1. Then, at the next step SP73, the data stored in the intermediate-processing register REG X1 is logically shifted in the right direction by (N−Num) bits so that the last one of the bits to be extracted coincides with the LSB.

Subsequently, the flow of the processing goes on to the next step SP74 to compare the number of bits stored in the intermediate-processing register REG X1 with Num in order to form a judgment whether or not Num is greater than the number of bits stored in the intermediate-processing register REG X1 where symbol Num denotes the number of bits to be extracted. If the number (Num) of bits to be extracted is smaller than the number of bits stored in the intermediate-processing register REG X1, the flow of the processing goes on to a step SP75. At this step, the contents of the intermediate-processing register REG X1 are trimmed to Num bits and a result of trimming is output. Finally, at the next step SP76, the execution of the processing is ended.

If the number (Num) of bits to be extracted is greater than the number of bits stored in the intermediate-processing register REG X1, on the other hand, the flow of the processing goes on from the step SP74 to a step SP77. At this step, the data stored in the intermediate-processing register REG X1 is shifted in the left direction by (N−Num−1) bits corresponding to the number of bits to be extracted. Subsequently, at the next step SP78, the data stored in the A register 31 is logically shifted in the right direction by (N−Num) bits and the residual bits are truncated. The result of the operations carried out at the step SP78 is stored in the intermediate-processing register REG X2. Then, at the next step SP79, the data stored in the register REG X1 and the data stored in the register REG X2 are subjected to a logical sum (OR) process to concatenate the data stored in the register REG X1 with the data stored in the register REG X2 and data obtained as a result of the concatenation process is stored in the register REG X1. The flow of the processing then goes on to the step SP75.

In the processor 13A, the processes of the steps SP72, SP73, and SP77 to SP79 are carried out by the hardware of the processing circuit 22. To be more specific, the processes are performed as bit-shift processing in the funnel shifter 42 and a series of masking processes. As a result, the processes can be carried out at a considerably high speed in comparison with the conventional apparatus.

Figure 19:
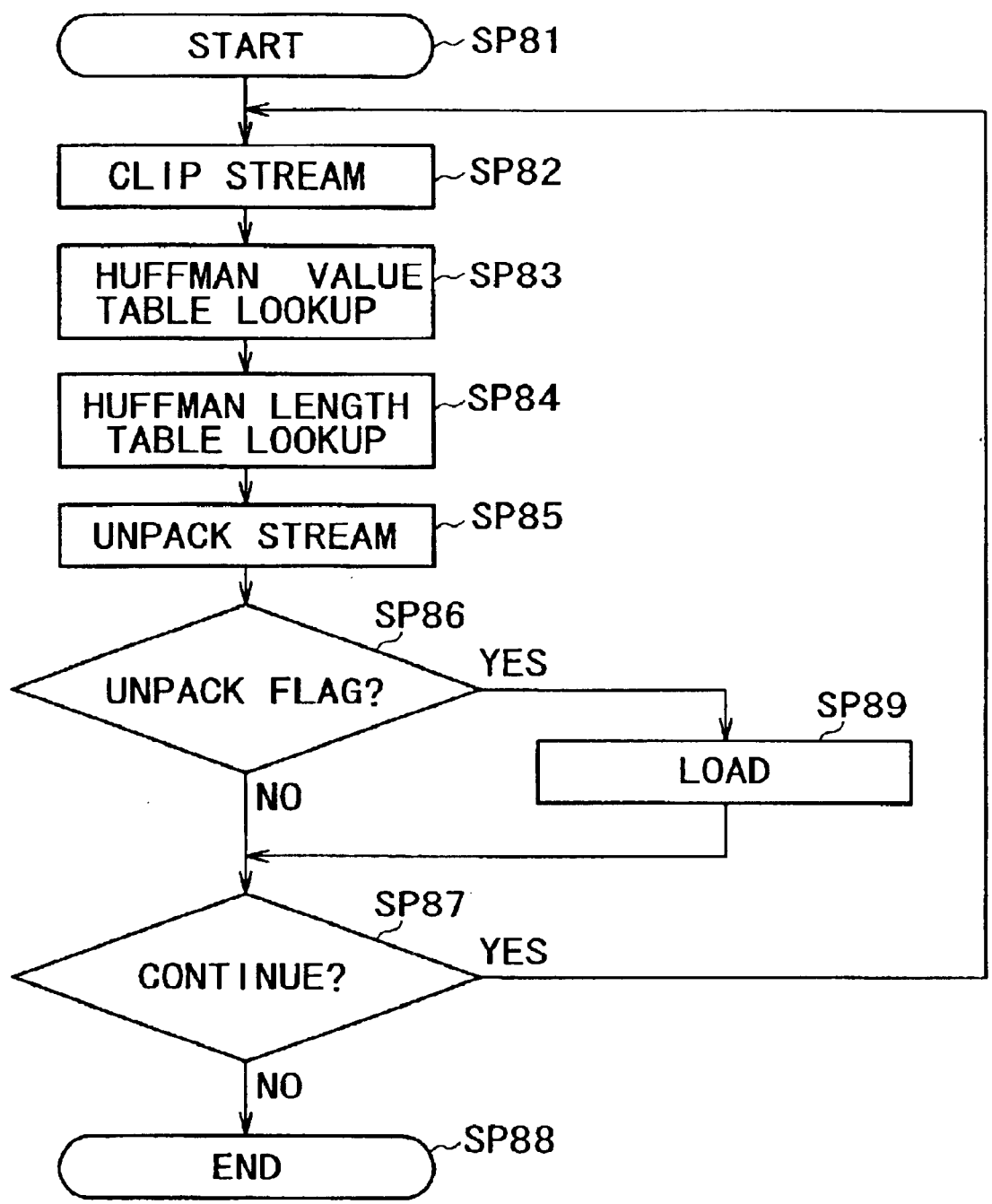
FIG. 19 shows a flowchart representing a processing procedure of a decoding process.

FIG. 19 shows a flowchart representing a process carried out in the processor 13A to decode audio data. In the decoding process, the processor 13A decompresses the audio data by executing the clipping and unpacking instructions described above repeatedly.

The flowchart begins with a step SP81 at which the processor 13A starts the processing by sequentially loading bit streams each having a length of 32 bits into the A register 31 and the B register 34. Then, at the next step SP82, the processor 13A executes a clipping instruction to extract data with a maximum code length according to the MP3 or ATRAC system from the A register 31 and the B register 34.

Subsequently, at the next step SP83, the extracted data is used for referencing a decoding lookup table 19A or 19B provided for the MP3 or ATRAC system to decode the data. As a result of decoding, a code is produced. Then, at the next step SP84, the extracted data is used for referencing a code-length detection lookup table 19A or 19B to find the length of the code obtained as a result of decoding at the step SP83.

Subsequently, at the next step SP85, the processor 13A carries out the unpacking instruction's processing based on the code length found at the step SP84. In this processing, the bit stream is masked for the data extracted at the step SP82 and the masked bit stream is held in the A register 31 and the B register 34. The flow of the processing then goes on to the next step SP86 to form a judgment whether or not the flag has been set. If the flag has not been set, the flow of the processing goes on to a step SP87 to form a judgment whether or not the processing is to be continued. If the processing is to be continued, the flow of the processing goes back to the step SP82. If the processing is not to be continued, on the other hand, the flow of the processing goes on to a step SP88 at which the execution of the processing is ended.

If the outcome of the judgment formed at the step SP86 indicates that the flag has been set, on the other hand, the flow of the processing goes on to a step SP89 at which the next bit stream is loaded into the B register 34. Then, the flow of the processing goes on to the step SP87.

As described above, the reproduction apparatus 10 is capable of processing variable-length coded data at a high speed and a low consumption power by carrying out simple processes.

As explained so far, in the reproduction apparatus 10, the A register 31 and the B register 34 are used as a main register and an auxiliary register respectively. In execution of an unpacking instruction specifying a bit count, the data generation circuit 41 sequentially inputs pieces of data stored in the main and auxiliary registers, passing on the data to the funnel shifter 42. The data generation circuit 41 and the funnel shifter 42 form a bit-shift circuit for shifting the data bit by bit in accordance with a pointer and the specified bit count. On the other hand, the bit-mask generation circuit 44 and the AND circuit 45 function as a mask circuit for masking data output by the bit-shift circuit on the basis of the pointer and the specified bit count. The subtractor 52 and the pointer register 26 form a pointer-updating circuit for updating the value of the pointer in accordance with the specified bit count.

The selectors 30 and 32 and other components function as a register-updating circuit for updating the contents of the main and auxiliary registers as well as a circuit for transferring the data stored in the auxiliary register to the main register if the data mask is stretched over the data stored in the auxiliary register. If the data stored in the auxiliary register is transferred to the main register, the next main stream is loaded into the auxiliary register. The inverter 56 serves as a flag circuit to changes the state of a flag if the data mask is stretched over the data stored in the auxiliary register. The register 25 is a register for holding the pointer for the main and auxiliary registers. The subtractor 52 is a circuit for computing a shift quantity for a bit-shift operation from the pointer and the bit count.

In a process of the packing instruction specifying a bit count, the data generation circuit 41 and the funnel shifter 42 function as a packing-process bit-shift circuit for shifting input data in accordance with a pointer. The bit-mask generation circuit 44, the AND circuits 45 and 47, and the inverter 46 form a packing-process mask circuit for masking data output by the packing-process bit-shift circuit and data output from the main register in accordance with the pointer and the bit count. The OR circuit 48 and the selector 30 function as a packing-process data-storing circuit for concatenating masked data output by the packing-process mask circuit with input data and storing a result of concatenation in the main register. The subtractor 52 and the pointer register 26 serve as a packing-process updating circuit for updating the pointer in accordance with a bit count specified in the packing instruction.

The subtractor 52 and other components form a circuit for, among other operations, computing a shift quantity for a bit-shift operation as is the case with the unpacking process.

In addition, in order to achieve a specified output bit count of output data obtained as a result of concatenation, the data generation circuit 41 and the funnel shifter 42 repeatedly carry out an operation to input data and an operation to pack the data in a low-order direction. In this way, input data with a bit count twice the specified output bit count can be obtained, and the funnel shifter 42 shifts the input data by as many bits as indicated by the pointer to generate a result having a size equal to the specified output bit count. The bit-mask generation circuit 44, the AND circuits 45 and 47, and the inverter 46 function as a circuit for generating a mask and using the mask for masking data output by the funnel shifter 42 in accordance with the pointer. The selectors 33 and 34 form a circuit for storing the data output by the funnel shifter 42 in the auxiliary register. The selectors 30 and 33 and other components are members of the configuration of a circuit, which is used for transferring the contents of the auxiliary register to the main register in case the tail of the input data is located at a position beyond a range defined by the output bit count. The subtractor 52 is a circuit for computing a shift quantity for a bit-shift operation, which is carried out by the funnel shifter 42, from the pointer and the bit count. The subtractor 52 also serves as a computation circuit for calculating the pointer. The inverter 56 is a circuit for setting the flag.

The configuration described above includes hardware capable of carrying out unpacking, packing, and clipping processes according to a bit count by execution of instructions each specifying the bit count. As a result, it is possible to process variable-length encoded data at a high speed and a low power consumption.

To be more specific, as described earlier by referring to FIG. 23, an unpacking process is carried out by execution of at least five conventional instructions, namely, a left-shift instruction, a logical right-shift instruction, a comparison instruction, a branch instruction, and an instruction to update the pointer. If a processing-flow branch occurs, a total of nine instructions need to be executed. In the case of this embodiment, on the other hand, a processor supporting conditional execution is employed. With such a processor, the processing can be completed always by execution of two instructions or, in other cases, by execution of two or three instructions. Due to execution of only fewer instructions, it is possible to process variable-length encoded data at a high speed and a low power consumption and to make the program simple. In addition, since the processing is never interrupted by a condition-checking instruction, a branch instruction, or the like, such a processor is extremely suitable for pipeline processing, which allows the speed to be increased. The merits described above are also exhibited in the case of the packing process as well.

In addition, by properly updating the pointer, the processing to extract data from a bit stream can be made simple. To put it in detail, in a process carried out by execution of conventional instructions, it is necessary to handle the processing position on the bit stream. In the case of this embodiment, on the other hand, the processing can be carried out without the need to be aware of an operation to handle the processing position at all. Thus, the processing can be made simple. As a result, the program can also be simplified due to the simpler processing.

Figure 24:
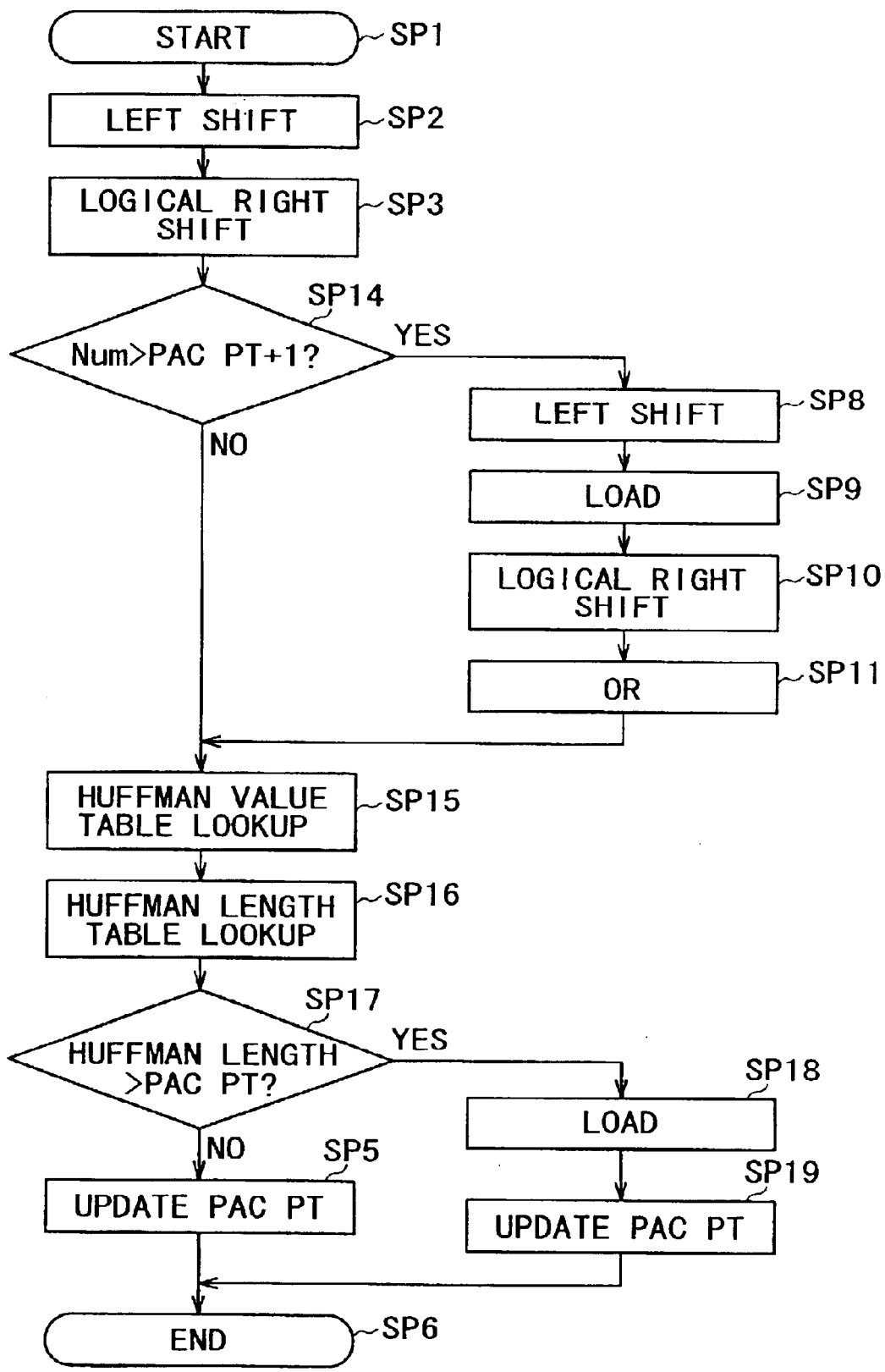
FIG. 24 shows a flowchart representing a decoding process based on the unpacking process represented by the flowchart shown in FIG. 23.

It particular, by execution of control through combination of the unpacking and clipping instructions, it is possible to decode a bit stream including variable-length encoded data always in a fixed number of cycles. That is to say, in a decoding process by execution of conventional instructions, as described earlier by referring to FIG. 24, the number of steps varies in dependence on whether or not a branch occurs in the flow of the processing. In consequence, the number of instructions required in the decoding process inevitably changes. In accordance with this embodiment, on the other hand, a variable-length encoded bit stream can always be decoded in a fixed number of cycles. As a result, a program's creation process and other processing can be made simple and, in addition, the process and the other processing can be carried out at a high speed.

Since a process can be carried out by execution of an instruction specifying a bit count as described above, a lookup table and a control program can each be changed to a variety of variations so that the good general-purpose characteristic can be maintained.

To put it in detail, there are provided a bit-shift circuit for inputting pieces of data stored in the main and auxiliary registers sequentially, shifting the data in accordance with a pointer and a bit count and outputting the shifted data, a mask circuit for masking the data output by the bit-shift circuit and outputting the masked data in accordance with the pointer and the bit count, and a pointer-updating circuit for updating the value of the pointer in accordance with the bit count by execution of an unpacking instruction specifying the bit count. It is thus possible to provide hardware capable of carrying out an unpacking process according to a bit count by execution of an unpacking instruction specifying the bit count. As a result, it is possible to process variable-length encoded data at a high speed and a low power consumption while maintaining the good general-purpose characteristic.

In addition, there are provided a packing-process bit-shift circuit for shifting input data in accordance with a pointer and outputting the shifted data, a packing-process mask circuit for masking the data output by the packing-process bit-shift circuit and outputting the masked data in accordance with the pointer and a bit count, a packing-process data-storing circuit for concatenating masked data output by the packing-process mask circuit with input data and storing a result of concatenation in the main register, and a packing process updating circuit for updating the pointer in accordance with the bit count. It is thus possible to provide hardware capable of carrying out a packing process according to a bit count by execution of a packing instruction specifying the bit count. As a result, it is possible to process variable-length encoded data at a high speed and a low power consumption while maintaining the good general-purpose characteristic.

In addition, in these configurations, these functions can be implemented by adding hardware with a small size to the existing processor having the conventional configuration.

Furthermore, these configurations can also be applied to instructions such as a multi-bit shift instruction and a rotation instruction by adoption of the funnel shifter. Thus, high extensibility can be brought about.

Moreover, in installation of the unpacking, packing, and clipping functions, a configuration common to these functions is adopted. Thus, these functions can be implemented by adding hardware with a small size.

In addition, there is provided a circuit for transferring the data stored in the auxiliary register to the main register if the data mask is stretched over the data stored in the auxiliary register. As a result, it is possible to effectively avoid addition of a processing step carried out by adoption of the conventional branch technique.

Furthermore, if the data mask is stretched over the data stored in the auxiliary register, the flag is set so that, by merely monitoring the flag, the following bit stream can be loaded into the auxiliary register in order to continue the processing. As a result, the processing can be made simple and the speed at which the processing is carried out can be increased.

Thus, in the processor implemented by this embodiment, the extremely general specifications allow the maximum bit length to keep up with a variety of bit counts ranging from a small bit count to a large bit count of 32 bits. As a result, the processor can be used for processing both pictures and sounds and applied to a large number of systems with ease.

(2): Second Embodiment

Figure 20:
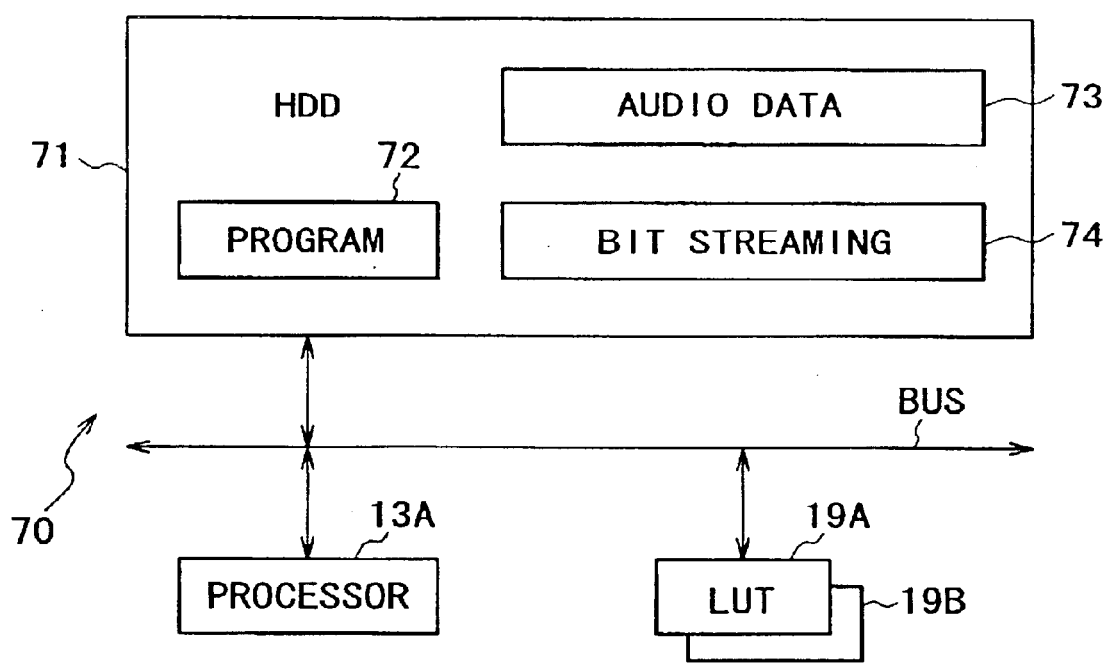
FIG. 20 is a block diagram showing an audio-data-processing apparatus implemented by a second embodiment of the present invention.

FIG. 20 is a block diagram showing an audio-data-processing apparatus 70 implemented by a second embodiment of the present invention. The audio-data-processing apparatus 70 includes a processor 13A for executing a program 72 stored in advance in a hard-disc drive 71 while referencing lookup tables 19A and 19B in order to sequentially decode pieces of audio data 73, which have also been stored in the hard-disc drive 71 in advance, in accordance with the MP3 or ATRAC technique and in order to store a bit stream 74 obtained as a result of decoding in the hard-disk drive 71. It is to be noted that the second embodiment's components identical with their counterparts employed in the first embodiment are denoted by the same reference numerals and reference notations as the counterparts and explanation of the identical components is not repeated.

Figure 21:
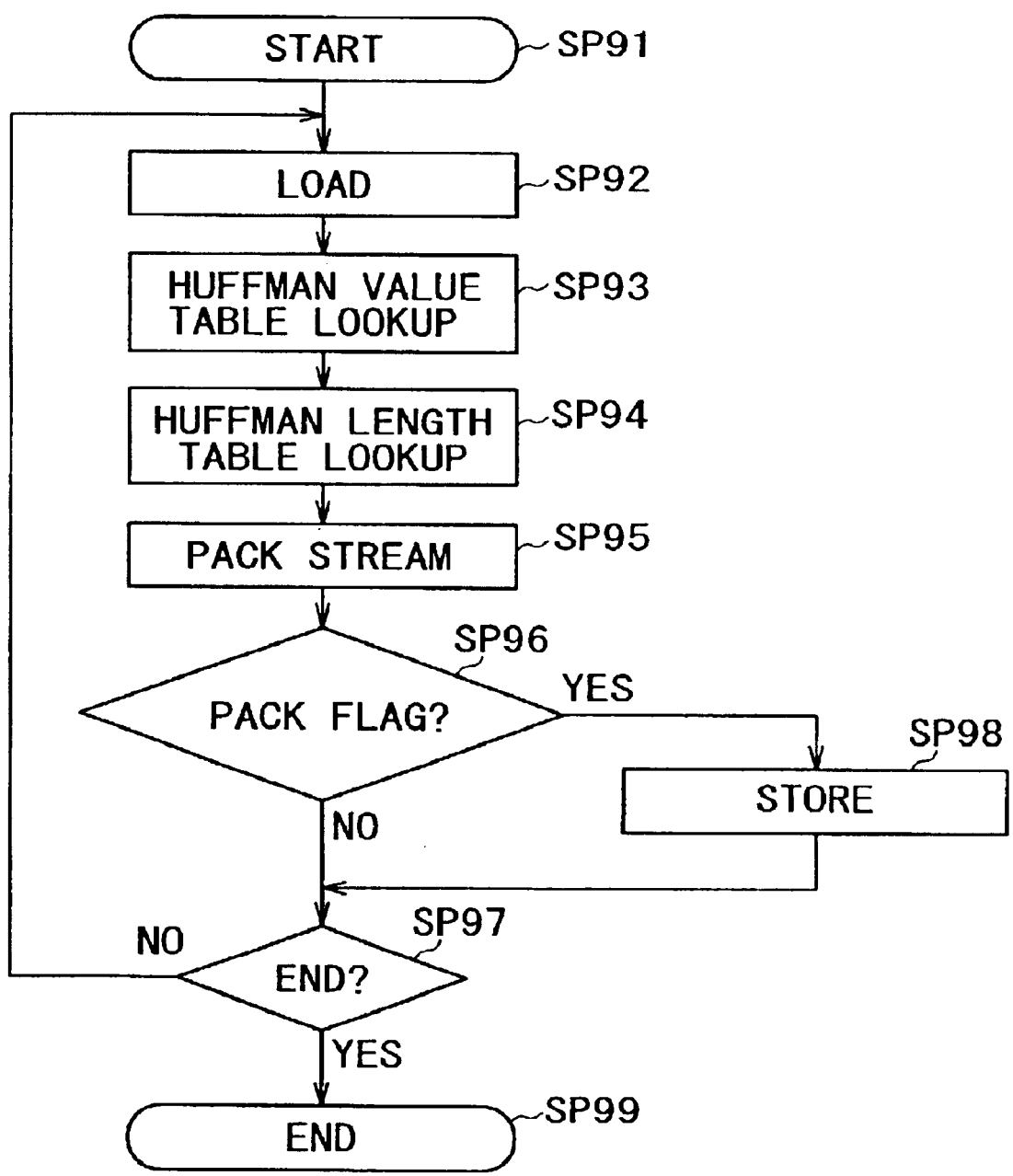
FIG. 21 shows a flowchart representing the procedure of a process carried out by a processor employed in the audio-data-processing apparatus shown in FIG. 20.

FIG. 21 shows a flowchart representing the processing procedure of a decoding process carried out by the processor 13A. As shown in the figure, the processing procedure represented by the flowchart begins with a step SP91 at which the registers 25, the A register 31, the register 33, and other registers are initialized. Then, at the next step SP92, the first word of audio data is loaded. Subsequently, at the next step SP93, the lookup table 19A or 19B is referenced to obtain variable-length encoded data of the Huffman code for this word of audio data. Then, at the next step SP94, the same lookup table 19A or 19B is referenced to find a bit count of this encoded data.

Subsequently, at the next step SP95, the processor 13A executes the packing instruction to supply this encoded data to the processing unit 21, which concatenates the encoded data with data stored in the A register 31 and stores the result of the concatenation in the processing unit 21. Then, the flow of the processing goes on to the next step SP96 to form a judgment whether or not the flag has been set. If the result of the judgment is a negation, the flow of the processing goes on to a step SP97. At this step, the processor 13A forms a judgment whether or not all the audio data has been processed. If the result of the judgment is a negation, the flow of the processing goes back to the step SP92.

If the outcome of the judgment formed at the step SP96 indicates that the flag has been set, on the other hand, the flow of the processing goes on to a step SP98 at which data "Dest" output by the processing unit 21 is stored in the hard-disk drive 71. Then, the flow of the processing goes on to the step SP97. In this way, the processor 13A carries out a variable-length decoding process on the pieces of audio data 73 sequentially to generate a bit stream. After all the pieces of audio data have been processed, the flow of the processing goes on from the step SP97 to the step SP99 at which the execution of the processing is ended.

In this embodiment, the processor 13A can also be applied to an encoder to obtain the same effects as the first embodiment.

(3): Third Embodiment

In the embodiments described above, the present invention is applied to a 32-bit processor. It is to be noted, however, that the scope of the present invention is not limited to the embodiments. That is to say, the present invention can also be widely applied to a processor, an encoder, and a decoder, which are provided for processing data having a different size.

In addition, in the embodiments described above, the present invention is applied to processing of audio data in which the audio data is encoded and decoded by adoption of the ATRAC or MP3 technique. However, the scope of the present invention is not limited to the embodiments. That is to say, the present invention can also be widely applied to processing of audio data by adoption of a technique other than the ATRAC or MP3 technique and processes in which data other than audio data is encoded and decoded.

As described above, in accordance with the present invention, there is configured hardware capable of carrying out unpacking and packing processes by execution of instructions each specifying a bit count. As a result, it is possible to process variable-length encoded data at a high speed and a low power consumption while maintaining the good general-purpose characteristic.

While a preferred embodiment of the invention has been described using specific terms, such description is for illustrative purposes only, and it is to be understood that changes and variations may be made without departing from the spirit or scope of the following claims.

What is claimed is:

1. A processor comprising:
a bit-shift circuit for inputting pieces of data held sequentially in a main register and an auxiliary register, shifting said piece of data bit after bit in accordance with a pointer and a bit count and outputting said shifted data by execution of an unpacking instruction specifying said bit count;
a mask circuit for masking data output by said bit-shift circuit in accordance with said pointer and said bit count in the execution of said unpacking instruction; and
a pointer-updating circuit for updating the value of said pointer by said bit count in the execution of said unpacking instruction.

2. A processor according to claim 1, said processor further having a register-updating circuit for updating contents of said main register or said auxiliary register by using data output by said bit-shift circuit.

3. A processor according to claim 1, said processor further having a circuit, which is used for transferring contents of said auxiliary register to said main register in case a mask used by said mask circuit for masking data is extended over data stored in said auxiliary register.

4. A processor according to claim 1, said processor further having a flag circuit, which is used for changing the state of a flag in case a mask used by said mask circuit for masking data is extended over data stored in said auxiliary register.

5. A processor according to claim 1, said processor further having a register for holding said pointer for said main register and said auxiliary register.

6. A processor according to claim 1, said processor further having a circuit for calculating a shift quantity, by which said bit-shift circuit shifts data, from said pointer and said bit count.

7. A processor according to claim 1 wherein the maximum value of a bit count specified in said unpacking instruction is equal to the size of said main register or the size of said auxiliary register.

8. A processor according to claim 1, said processor further having:
a clipping-process bit-shift circuit for inputting pieces of data held sequentially in said main register and said auxiliary register, shifting said piece of data bit after bit in accordance with said pointer and said bit count and outputting said shifted data by execution of a clipping instruction specifying said bit count; and
a clipping-process mask circuit for masking data output by said clipping-process bit-shift circuit in accordance with said pointer and said bit count in the execution of said clipping instruction.

9. A processor according to claim 8 wherein at least some circuitry is shared as circuitry common to said bit-shift circuit, said mask circuit, and said pointer-updating circuit, which are provided for said unpacking instruction, and said clipping-process bit-shift circuit and said clipping-process mask circuit, which are provided for said clipping instruction.

10. A processor comprising:
a packing-process bit-shift circuit for shifting input data bit after bit in accordance with a pointer and outputting said shifted data by execution of a packing instruction specifying a bit count;
a packing-process mask circuit for masking data output by said packing-process bit-shift circuit and data output from a main register in accordance with said pointer and said bit count in the execution of said packing instruction;
a packing-process data-storing circuit for concatenating data output by said packing-process mask circuit with said input data and storing a result of concatenation in said main register in the execution of said packing instruction; and
a packing-process pointer-updating circuit for updating the value of said pointer by said bit count in the execution of said packing instruction.

11. A processor according to claim 9, said processor further having:
a packing-process bit-shift circuit for shifting input data bit after bit in accordance with said pointer and outputting said shifted data by execution of a packing instruction specifying a bit count;
a packing-process mask circuit for masking data output by said packing-process bit-shift circuit and data output from said main register in accordance with said pointer and said bit count in the execution of said packing instruction;

a packing-process data-storing circuit for concatenating masked data output by said packing-process mask circuit with said input data and storing a result of concatenation in said main register in the execution of said packing instruction; and a packing-process pointer-updating circuit for updating the value of said pointer by said bit count in the execution of said packing instruction, wherein at least some circuitry is shared as circuitry common to said bit-shift circuit, said mask circuit, and said pointer-updating circuit, which are provided for said unpacking instruction, and said packing-process bit-shift circuit, said packing-process mask circuit, packing-process data-storing circuit and packing-process pointer-updating circuit, which are provided for said packing instruction.

12. A processor according to claim 10 wherein:

said bit-shift circuit has a funnel shifter for repeatedly carrying out an operation to input said input data and an operation to pack said input data in a low-order direction for an output bit count of output data obtained as a result of concatenation in order to obtain said input data with a bit count twice said output bit count and for shifting said input data by as many bits as indicated by said pointer to generate data having a size equal to said output bit count; whereas said processor has:

a circuit for storing said data output by said funnel shifter in said auxiliary register; and a circuit, which is used for transferring contents of said auxiliary register to said main register in case the tail of said input data is located beyond a range indicated by said output bit count.

13. A processor according to claim 10, said processor further having a circuit for calculating a shift quantity, by which said packing-process bit-shift circuit shifts data, from said pointer and said bit count.

14. A processor according to claim 12, said processor further having a flag circuit, which is used for changing the state of a flag in case contents of said auxiliary register are transferred to said main register.

15. A processor according to claim 10, said processor further having a circuit for calculating a value of said pointer.

16. A processor according to claim 10, said processor further having a register for holding said pointer for said main register.

17. An encoder for generating a bit stream by concatenating pieces of data obtained as a result of a variable-length encoding process based on a packing process carried out by a processor, which is capable of packing input data, even if said input data is variable-length encoded data, by employing components including:

a packing-process bit-shift circuit for shifting said input data bit after bit in accordance with a pointer and outputting said shifted data by execution of a packing instruction specifying a bit count;

a packing-process mask circuit for masking data output by said packing-process bit-shift circuit and data output from a main register in accordance with said pointer and said bit count in the execution of said packing instruction;

a packing-process data-storing circuit for concatenating data output by said packing-process mask circuit with said input data and storing a result of concatenation in said main register in the execution of said packing instruction; and a packing-process pointer-updating circuit for updating the value of said pointer by said bit count in the execution of said packing instruction.

18. A decoder for sequentially processing pieces of variable-length encoded data, which are extracted from a bit stream comprising said pieces of variable-length encoded data in an unpacking process carried out by a processor capable of unpacking a continuous portion of said bit stream, even if said continuous portion is spread over a main register and an auxiliary register, by employing components including:

a bit-shift circuit for inputting pieces of data held sequentially in said main register and said auxiliary register, shifting said piece of data bit after bit in accordance with a pointer and a bit count and outputting said shifted data by execution of an unpacking instruction specifying said bit count;

a mask circuit for masking data output by said bit-shift circuit in accordance with said pointer and said bit count in the execution of said unpacking instruction; and a pointer-updating circuit for updating the value of said pointer by said bit count in the execution of said unpacking instruction.

19. An electronic apparatus for processing variable-length encoded data by using a processor, which is capable of processing input data, even if said input data is variable-length encoded data, by employing components including:

a packing-process bit-shift circuit for shifting said input data bit after bit in accordance with a pointer and outputting said shifted data by execution of a packing instruction specifying a bit count;

a packing-process mask circuit for masking data output by said packing-process bit-shift circuit and data output from a main register in accordance with said pointer and said bit count in the execution of said packing instruction;

a packing-process data-storing circuit for concatenating data output by said packing-process mask circuit with said input data and storing a result of concatenation in said main register in the execution of said packing instruction; and a packing-process pointer-updating circuit for updating the value of said pointer by said bit count in the execution of said packing instruction.

20. An electronic apparatus for processing variable-length encoded data by using a processor, which is capable of processing a continuous portion of a bit stream, even if said continuous portion is spread over a main register and an auxiliary register, by employing components including:

a bit-shift circuit for inputting pieces of data held sequentially in said main register and said auxiliary register, shifting said piece of data bit after bit in accordance with a pointer and a bit count and outputting said shifted data by execution of an unpacking instruction specifying said bit count;

a mask circuit for masking data output by said bit-shift circuit in accordance with said pointer and said bit count in the execution of said unpacking instruction; and a pointer-updating circuit for updating the value of said pointer by said bit count in the execution of said unpacking instruction.

* * * * *